United States Patent
Igarashi et al.

(10) Patent No.: US 9,063,423 B2
(45) Date of Patent: *Jun. 23, 2015

(54) LITHOGRAPHIC PRINTING PLATE PRECURSORS AND USE

(71) Applicant: Eastman Kodak Company, Rochester, NY (US)

(72) Inventors: Akira Igarashi, Kumagaya (JP); Yuuki Torihata, Tatebayashi (JP); Harald Baumann, Osterode (DE); Udo Dwars, Herzberg (DE); Christopher D. Simpson, Osterode (DE); Saija Werner, Hattorf (DE); Michael Flugel, Osterode (DE)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/779,906

(22) Filed: Feb. 28, 2013

(65) Prior Publication Data
US 2014/0242517 A1    Aug. 28, 2014

(51) Int. Cl.
| | |
|---|---|
| G03C 1/00 | (2006.01) |
| G03F 7/00 | (2006.01) |
| G03F 7/09 | (2006.01) |
| B41C 1/10 | (2006.01) |
| G03F 7/11 | (2006.01) |

(52) U.S. Cl.
CPC ............... G03F 7/09 (2013.01); B41C 1/1016 (2013.01); G03F 7/092 (2013.01); G03F 7/11 (2013.01); B41C 2210/04 (2013.01); B41C 2210/06 (2013.01); B41C 2210/08 (2013.01); B41C 2210/10 (2013.01); B41C 2201/02 (2013.01); B41C 2201/12 (2013.01); B41C 2201/14 (2013.01)

(58) Field of Classification Search
CPC .......................................................... G03F 7/00
USPC .......... 430/270.1, 271.1, 302; 101/453, 463.1
See application file for complete search history.

(56) References Cited

U.S. PATENT DOCUMENTS

| | | | |
|---|---|---|---|
| 5,563,023 A | 10/1996 | Kangas et al. | |
| 8,105,751 B2 | 1/2012 | Endo | |
| 2007/0231739 A1 | 10/2007 | Koizumi | |
| 2007/0231740 A1 | 10/2007 | Yanaka et al. | |
| 2007/0287095 A1* | 12/2007 | Endo | 430/270.1 |
| 2010/0151385 A1 | 6/2010 | Ray et al. | |
| 2011/0053085 A1* | 3/2011 | Huang et al. | 430/286.1 |
| 2013/0323643 A1* | 12/2013 | Balbinot et al. | 430/273.1 |

FOREIGN PATENT DOCUMENTS

| | | |
|---|---|---|
| EP | 1 840 656 A1 | 10/2007 |
| EP | 2 042 306 A2 | 4/2009 |
| EP | 2 267 540 A1 | 12/2010 |
| JP | 06043656 A * | 2/1994 |
| JP | 2007-245690 | 9/2007 |
| JP | 2007-272143 | 10/2007 |
| JP | 2008-015503 | 1/2008 |
| JP | 2008-089916 | 4/2008 |
| JP | 2010-276824 | 12/2010 |
| WO | 2005/038526 | 4/2005 |

OTHER PUBLICATIONS

U.S. Appl. No. 13/482,151, filed May 29, 2012, Negative-Working Lithographic Printing Plate Precursors, Domenico Balbinot et al.

* cited by examiner

Primary Examiner — Chanceity Robinson
(74) Attorney, Agent, or Firm — J. Lanny Tucker

(57) ABSTRACT

Negative-working lithographic printing plate precursor a negative-working imageable layer and an outermost water-soluble overcoat layer that is disposed directly on the negative-working imageable layer. The outermost water-soluble overcoat layer comprises: (1) one or more film-forming water-soluble polymeric binders, (2) organic wax particles, and (3) non-wax matte particles. The outermost water-soluble overcoat layer has a dry thickness (t) that is defined by the following equation (I):

$t = w/r$ wherein w is the dry coverage of the outermost water-soluble overcoat layer in g/m², and r is 1 g/cm³. The organic wax particles have an average largest dimension D(wax) that is less than 0.9 of t (in μm), and the non-wax matte particles have an average largest dimension D(matte) that defined by the following equation (II):

1.5 times $t \leq D(\text{matte}) \leq 40$ times $t$ (in μm).

21 Claims, No Drawings

LITHOGRAPHIC PRINTING PLATE PRECURSORS AND USE

FIELD OF THE INVENTION

This invention relates to a negative-working lithographic printing plate precursor that comprises a unique water-soluble overcoat layer comprising both organic wax particles and non-wax matte particles. In addition, this invention provides stacks of these precursors from which interleaf papers are omitted between adjacent precursors. This invention also relates to a method of making lithographic printing plates from the lithographic printing plate precursors of this invention.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise one or more imageable layers applied over the hydrophilic surface of a substrate. The imageable layers include one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital or thermal imaging has become increasingly important in the printing industry because of their stability to ambient light. The imageable elements used for the preparation of lithographic printing plates (that is, lithographic printing plate precursors) have been designed to be sensitive to heat or infrared radiation and can be exposed using thermal heads of more usually, UV, visible, or infrared laser diodes that image in response to signals from a digital copy of the image in a computer a platesetter. This "computer-to-plate" technology has generally replaced the former technology where masking films were used to image the elements.

Various radiation-sensitive compositions are used in negative-working lithographic printing plate precursors as described for example in U.S. Pat. No. 6,309,792 (Hauck et al.), U.S. Pat. No. 6,893,797 (Munnelly et al.), U.S. Pat. No. 6,727,281 (Tao et al.), U.S. Pat. No. 6,899,994 (Huang et al.), and U.S. Pat. No. 7,429,445 (Munnelly et al.), U.S. Patent Application Publications 2002/0168494 (Nagata et al.), 2003/0118939 (West et al.), and EP Publications 1,079,276A2 (Lifka et al.) and 1,449,650A2 (Goto et al.).

After imaging, the imaged precursors are developed (processed) to remove the non-imaged (non-exposed) regions of the imageable layer. Often, lithographic printing plate precursors are designed with a water-soluble topcoat or water-soluble oxygen-impermeable barrier layer disposed over the negative-working, photosensitive imageable layer. This topcoat is used to improve high polymerization rate during imaging by assuring higher imageable layer sensitivity. Such water-soluble topcoats can be removed prior to or during processing of the imaged precursor.

The imaged precursors can be processed (developed) off-press by using a suitable processing solution (developer) that removes the non-exposed regions of the imageable layer. Alternatively, the imaged precursors can be processed on-press (without intermediate processing) at the beginning of the printing operation.

Such lithographic printing plate precursors containing a water-soluble topcoat are generally transported and stored after manufacture in stacks of dozens or hundreds of individual precursors. Interleaf paper is often inserted between individual adjacent precursors to prevent scratches in the topmost surface. However, despite the presence of interleaf papers, the water-soluble topcoat surface can still be scratched during transportation or handling (for example, when removing the interleaf paper in an automated plate loader), leading to a loss in sensitivity in the scratched areas. Furthermore, there is a need for improving the reliability of separating adjacent lithographic printing plate precursors and interleaf papers, especially when automized plate loaders are used.

U.S. Patent Application Publication 2010/0151385 (Ray et al.) describes negative-working lithographic printing plate precursors supplied in a stack. Each precursor has a water-soluble topcoat having a dry coating weight of less than 1 $g/m^2$ so that interleaf paper can be omitted from the stack. Large organic or inorganic particles (1-6 μm) are optional relative to the topcoat thickness or dry coating weight (<1 $g/m^2$).

U.S. Pat. No. 5,563,023 (Kangas et al.) describes photoimageable elements having a protective overcoats can contain organic polymeric beads to provide anti-blocking properties, which organic polymeric beads have a particle size range of 0.75-75 μm.

U.S. Patent Application Publication 2011/0053085 (Huang et al.) describes lithographic printing plate precursors that are designed to be stored, shipped, and used in stacks without interleaf paper between individual precursors. This result is achieved by incorporating certain core-shell polymeric particles having an average diameter of from 3 μm to 20 μm into the outermost precursor layer such as an oxygen barrier topcoat.

In addition, U.S. Pat. No. 8,105,751 (Endo) describes the use of silica-coated organic resin fine particles in mica-containing uppermost protective layers of lithographic printing plate precursors.

It was found in extensive studies that the blocking properties between lithographic printing plate precursors in a stack without interleaf paper can be improved with particles having particles sizes of at least 1.5 times of the oxygen barrier topcoat thickness. Furthermore, it was found that the reliability of separating interleaf paper and plates is improved with those particles.

However, the disadvantage of this approach is that the susceptibility for scratching during transportation and handling is increased.

It was recently found that improvements in outer layer scratch resistance can be obtained by incorporating hydrocarbon wax particles in such layers, as described in copending and commonly assigned U.S. Ser. No. 13/482,151 (filed May 29, 2012 by Balbinot and Jarek).

There is a need for further improvement in scratch resistance and a lower tendency for "blocking" during stacking, transportation, and use of negative-working lithographic printing plate precursors. It is also desirable to have the option to avoid the use of interleaf papers without a reduction in scratch resistance or an increase in the "blocking" tendency in the stacked precursors.

SUMMARY OF THE INVENTION

The present invention provides a negative-working lithographic printing plate precursor that comprises:

a substrate, a negative-working imageable layer disposed over the substrate, the negative-working imageable layer comprising a free radically polymerizable component, an initiator composition that is capable of generating free radicals upon exposure to imaging radiation, a radiation absorbing compound, and a polymeric binder, and an outermost water-soluble overcoat layer that is disposed directly on the negative-working imageable layer, the outermost water-soluble overcoat layer having a dry thickness (t), in μm, that is defined by the following equation (I):

$$t = w/r$$

wherein w is the dry coverage of the outermost water-soluble overcoat layer in g/m$^2$, and r is 1 g/cm$^3$, the outermost water-soluble overcoat layer comprising:

(1) one or more film-forming water-soluble polymeric binders, (2) organic wax particles having an average largest dimension D(wax) that is less than 0.9 of t (in μm), and (3) non-wax matte particles having an average largest dimension D(matte) that defined by the following equation (II):

$$1.5 \text{ times } t \leq D(\text{matte}) \leq 40 \text{ times } t (\text{in μm}).$$

In addition, the present invention provides a stack of a plurality of negative-working lithographic printing plate precursors, at least two adjacent precursors being precursors of any embodiments of this invention, wherein the at least the two adjacent precursors are stacked without interleaf paper between them.

Further, the present invention provides a method for preparing a lithographic printing plate, comprising:

imagewise exposing the negative-working lithographic printing plate precursor of any embodiment of this invention to form an imaged precursor with exposed regions and non-exposed regions in the negative-working imageable layer, and processing the imaged precursor, to remove the non-exposed regions in the negative-working imageable layer to prepare a lithographic printing plate.

In some embodiments, the negative-working lithographic printing plate precursor of this invention used in this method is sensitive to infrared radiation and the imagewise exposing is carried out at a $\lambda_{max}$ of at least 700 nm and up to and including 1400 nm. In other embodiments, the precursor of this invention is sensitive to and imagewise exposed in the "UV" (violet) region and the imagewise exposing is carried out at a $\lambda_{max}$ of at least 250 nm and up to and including 450 nm.

The method can also further comprise:

mounting the lithographic printing plate onto a printing press after the processing without any post processing step such as a post processing curing, water rinsing, or gumming operation.

This method of this invention is also useful when it is carried out using a processing solution that removes both the non-exposed regions of the negative-working imageable layer and the outermost water-soluble overcoat layer.

In addition, the method of this invention can be carried out by processing the imaged precursor by using a processing solution that both removes the non-exposed regions of the negative-working imageable layer (and outermost water-soluble overcoat layer) and provides a protective coating over the processed precursor printing surface, and the method further comprising mounting the lithographic printing plate onto a printing press after the processing without any post-processing step (as noted above).

But in other embodiments, the processing of the imaged precursor is carried out using a processing solution having a pH of at least 3 and up to and including 13, and comprising at least one compound selected from the group consisting of a nonionic surfactant, an anionic surfactant, a hydrophilic film-forming polymer, and a neutrally-charged hydrophilic compound other than a nonionic or anionic surfactant.

In some embodiments, processing of the imaged lithographic printing plate precursor is followed by rinsing or gumming the resulting lithographic printing plate, drying the lithographic printing plate, and optionally pre-heating the imaged precursor before the processing step.

As described in more detail herein, it is also possible to process certain imaged precursors according to the present invention to remove the non-exposed regions in the negative-working imageable layer on-press using a lithographic printing ink, fountain solution, or both a lithographic printing ink and fountain solution.

The present invention provides a negative-working lithographic printing plate precursor that exhibit improved scratch resistance in the outermost layer, and reduced blocking between adjacent precursors. Moreover, interleaf papers can be more easily separated from lithographic printing plates or omitted between stacked adjacent precursors without losing these improvements in scratch resistance and reduced blocking.

These advantages are achieved using an outermost water-soluble overcoat that comprises two different types of particles of different sizes, one type of particles being small in size so that they can be totally embedded within the overcoat and the other type of particles having a larger size so that they protrude out of the overcoat to a certain degree. The particular relationships of the two particle sizes and the dry thickness of the outermost water-soluble overcoat are critical to providing all of the advantages achieved with the present invention.

As noted herein, the outermost water-soluble overcoat layer has a dry thickness (t), in μm, that is defined by the following equation (I):

$$t = w/r$$

wherein w is the dry coverage of the outermost water-soluble overcoat layer in g/m$^2$, and r is the density of the outermost water-soluble overcoat layer, which is considered 1 g/cm$^3$ in the practice of this invention. The organic wax particles dispersed within the one or more film-forming water-soluble polymeric binders have an average largest dimension D(wax) that is less than 0.9 of t (in μm), and the non-wax matte particles have an average largest dimension D(matte) that defined by the following equation (II):

$$1.5 \text{ times } t \leq D(\text{matte}) \leq 40 \text{ times } t (\text{in μm}),$$

wherein D(wax) and D(matte) are determined as described below.

When these relationships are not met, the scratch resistance and blocking resistance are less satisfactory. However, the present invention provides improved scratch resistance and reduced blocking. Improved scratch resistance helps prevent defects when the precursors are moved in the manufacturing line as wells in the automated imaging and processing equipment. It is also advantageous that the precursors of this invention can be assembled, shipped, and stored in stacks without interleaf paper between adjacent precursors. Without the interleaf papers, there is reduced moisture introduced into the stack of precursors. The omission of interleaf papers obviously reduces costs for papers and interleaf paper removal systems (reduced equipment).

DETAILED DESCRIPTION OF THE INVENTION

Definitions

As used herein to define various components of the imageable layer compositions and formulations, outermost water-soluble overcoat layers, and developer or processing solutions, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless the context indicates otherwise, when used herein, the terms "lithographic printing plate precursor", "precursor", and "negative-working lithographic printing plate precursor" are meant to be references to embodiments of the present invention.

The term "support" is used herein to refer to an aluminum-containing material (web, sheet, foil, or other form) that is then treated to prepare a "substrate" that refers to the hydrophilic article upon which various layers are coated.

Unless otherwise indicated, the terms "overcoat", "outermost water-soluble overcoat layer", and "topcoat" are meant to refer to the same composition and layer.

Unless otherwise indicated, percentages refer to percents by dry weight of a composition or layer, or % solids of a solution.

As used herein, the term "radiation absorber" refers to compounds that are sensitive to certain wavelengths of radiation and can convert photons into heat within the layer in which they are disposed.

As used herein, the term "infrared" refers to radiation having a $\lambda_{max}$ of at least 700 nm and higher. In most instances, the term "infrared" is used to refer to the "near-infrared" region of the electromagnetic spectrum that is defined herein to be at least 700 nm and up to and including 1400 nm.

As used herein, the term "UV radiation" generally refers to radiation having a $\lambda_{max}$ of at least 250 nm and up to and including 450 nm.

The term "organic wax" refers to a chemical compound that are "plastic" or malleable near ambient temperatures and that characteristically melt at a temperature above 45° C. to provide a low viscosity liquid. An organic wax is generally insoluble in water but they are soluble in organic, nonpolar solvents. The organic wax can be synthetically prepared or naturally-occurring, and include but are not limited to animal waxes, plant waxes, and petroleum-derived waxes. Naturally occurring waxes generally comprise fatty acids and long-chain alcohols while synthetic waxes are generally long-chain hydrocarbons without functional groups, but which can also include fluorinated hydrocarbons.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the terms "polymer" and "polymeric" refer to high and low molecular weight polymers including oligomers and includes homopolymers and copolymers.

The term "copolymer" refers to polymers that are derived from two or more different monomers, in random order along the polymer backbone. That is, they comprise recurring units having different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

The term "blocking" refers to inherent adhesion that occurs between contacting surfaces of two adjacent precursors. In general, this problem can be reduced by reducing the overall surface area of the two contacting surfaces.

Substrate

The substrate that is present in the precursor of this invention generally has a hydrophilic surface, or at least a surface that is more hydrophilic than the applied imageable layer(s) on the imaging side. The substrate comprises a support that can be composed of any material that is conventionally used to prepare lithographic printing plate precursors. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports can be modified on one or both flat surfaces with a "subbing" layer to enhance hydrophilicity, or paper supports can be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One useful substrate is composed of an aluminum support that can be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of at least 1.5 g/m$^2$ and up to and including 5 g/m$^2$ and more typically at least 3 g/m$^2$ and up to and including 4.3 g/m$^2$. Phosphoric acid anodization generally provides an oxide weight on the surface of from at least 1.5 g/m$^2$ and up to and including 5 g/m$^2$ and more typically at least 1 g/m$^2$ and up to and including 3 g/m$^2$.

An interlayer can be formed by treatment of the aluminum support with, for example, a silicate, dextrin, calcium zirconium fluoride, hexafluorosilicic acid, poly(vinyl phosphonic acid) (PVPA), vinyl phosphonic acid copolymer, poly[(meth)acrylic acid], or acrylic acid copolymer to increase hydrophilicity. Still further, the aluminum support can be treated with a phosphate solution that can further contain an inorganic fluoride (PF). The aluminum support can be electrochemically-grained, sulfuric acid-anodized, and treated with PVPA or PF using known procedures to improve surface hydrophilicity.

A substrate can also comprise a grained and sulfuric acid anodized aluminum-containing support that has also been treated with an alkaline or acidic pore-widening solution to provide its outer surface with columnar pores so that the diameter of the columnar pores at their outermost surface is at least 90% of the average diameter of the columnar pores. This substrate further comprises a hydrophilic layer disposed directly on the grained, sulfuric acid anodized and treated aluminum-containing support, and the hydrophilic layer comprises a non-crosslinked hydrophilic polymer having carboxylic acid side chains. Further details of such substrates and methods for providing them are provided in copending and commonly assigned U.S. Ser. No. 13/221,936 (filed Aug. 31, 2011 by Hayashi) or U.S. Patent Application Publication No. 2013/0052582, the disclosure of which is incorporated herein by reference.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate can be coated with antistatic agents, a slipping layer, or a matte layer to improve handling and "feel" of the imageable element.

Negative-Working Imageable Layers

Embodiments of this invention can be formed by suitable application of a negative-working radiation-sensitive composition as described below to a suitable substrate to form a negative-working (radiation sensitive) imageable layer comprising a free radically polymerizable component, a radiation absorber, an initiator composition that is capable of generating free radicals upon exposure to imaging radiation, and a polymeric binder, of which components are described in more detail below. There is generally only a single negative-working imageable layer comprising the radiation-sensitive composition but it is not the outermost layer in the precursor. As described in more detail below, an outermost water-soluble overcoat layer (also known as a topcoat) is disposed over the one or more negative-working imageable layers.

Many details of negative-working lithographic printing plate precursors are described for example, in EP Patent Publications 770,494A1 (Vermeersch et al.), 924,570A1 (Fujimaki et al.), 1,063,103A1 (Uesugi), EP 1,182,033A1 (Fujimako et al.), EP 1,342,568A1 (Vermeersch et al.), EP 1,449,650A1 (Goto), and EP 1,614,539A1 (Vermeersch et al.), U.S. Pat. No. 4,511,645 (Koike et al.), U.S. Pat. No. 6,027,857 (Teng), U.S. Pat. No. 6,309,792 (Hauck et al.), U.S. Pat. No. 6,569,603 (Furukawa et al.), U.S. Pat. No. 6,899,994 (Huang et al.), U.S. Pat. No. 7,045,271 (Tao et al.), U.S. Pat. No. 7,049,046 (Tao et al.), U.S. Pat. No. 7,261,998 (Hayashi et al.), U.S. Pat. No. 7,279,255 (Tao et al.), U.S. Pat. No. 7,285,372 (Baumann et al.), U.S. Pat. No. 7,291,438 (Sakurai et al.), U.S. Pat. No. 7,326,521 (Tao et al.), U.S. Pat. No. 7,332,253 (Tao et al.), U.S. Pat. No. 7,442,486 (Baumann et al.), U.S. Pat. No. 7,452,638 (Yu et al.), U.S. Pat. No. 7,524,614 (Tao et al.), U.S. Pat. No. 7,560,221 (Timpe et al.), U.S. Pat. No. 7,574,959 (Baumann et al.), U.S. Pat. No. 7,615,323 (Shrehmel et al.), and U.S. Pat. No. 7,672,241 (Munnelly et al.), and U.S. Patent Application Publications 2003/0064318 (Huang et al.), 2004/0265736 (Aoshima et al.), 2005/0266349 (Van Damme et al.), and 2006/0019200 (Vermeersch et al.), the disclosures of which are all incorporated herein by reference. Other negative-working compositions and elements are described for example in U.S. Pat. No. 6,232,038 (Takasaki), U.S. Pat. No. 6,627,380 (Saito et al.), U.S. Pat. No. 6,514,657 (Sakurai et al.), U.S. Pat. No. 6,808,857 (Miyamoto et al.), and U.S. Patent Publication 2009/0092923 (Hayashi), the disclosures of which are all incorporated herein by reference. The scope of precursors of this invention is not limited to these incorporated teachings. Some of the noted teachings relate to negative-working radiation sensitive compositions that are used in imaged precursors that are processed off-press using a suitable processing solution, while others relate to on-press developable negative-working radiation sensitive compositions. Both types of radiation sensitive compositions and negative-working precursors are contemplated for the present invention.

The radiation-sensitive compositions and negative-working imageable layers used in precursors of the present invention can generally include one or more polymeric binders that facilitate the developability of the imaged precursors. Such polymeric binders include but are not limited to, those that are not generally crosslinkable and are usually film-forming in nature (dissolvable in coating solvent) but other polymeric binders can be present at least partially as discrete particles (non-agglomerated). Such polymeric binders can be present as discrete particles having an average particle size of at least 10 nm and up to and including 500 nm, and typically of at least 100 nm and up to and including 450 nm, and that are generally distributed uniformly within that layer. The particulate polymeric binders exist at room temperature as discrete particles, for example in an aqueous dispersion. Such polymeric binders generally have a number average molecular weight ($M_n$) of at least 5,000 and typically at least 20,000 and up to and including 1,000,000, or of at least 30,000 and up to and including 200,000, as determined by Gel Permeation Chromatography.

Useful particulate polymeric binders generally include polymeric emulsions or dispersions of polymers having hydrophobic backbones to which are directly or indirectly linked pendant poly(alkylene oxide) side chains (for example at least 10 alkylene glycol units), optionally cyano or phenyl side groups, or both types of side chains or side groups, that are described for example in U.S. Pat. No. 6,582,882 (Pappas et al.), U.S. Pat. No. 6,899,994 (noted above), U.S. Pat. No. 7,005,234 (Hoshi et al.), and U.S. Pat. No. 7,368,215 (Munnelly et al.), and US Patent Application Publication 2005/0003285 (Hayashi et al.), the disclosures of which are all incorporated herein by reference. More specifically, such polymeric binders include but are not limited to, graft copolymers having both hydrophobic and hydrophilic segments, block and graft copolymers having polyethylene oxide (PEO) segments, polymers having both pendant poly(alkylene oxide) segments and cyano groups, in recurring units arranged in random fashion to form the polymer backbone, and various hydrophilic polymeric binders that can have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art.

Alternatively, the particulate polymeric binders can have a backbone comprising multiple (at least two) urethane moieties. Such polymeric binders generally have a number average molecular weight ($M_n$) of at least 2,000 and typically at least 100,000 and up to and including 500,000, or at least 100,000 and up to and including 300,000, as determined by Gel Permeation Chromatography.

Other useful polymeric binders are particulate poly(urethane-acrylic) hybrids that are distributed (usually uniformly) throughout the imageable layer. Each of these hybrids has a number average molecular weight ($M_n$) of at least 50,000 and up to and including 500,000 and the particles have an average particle size of at least 10 nm and up to and including 10,000 nm (typically at least 30 nm and up to and including 500 nm or at least 30 nm and up to and including 150 nm). These hybrids can be either "aromatic" or "aliphatic" in nature depending upon the specific reactants used in their manufacture. Blends of particles of two or more poly(urethane-acrylic) hybrids can also be used. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the poly(urethane-acrylic) hybrid particles in a suitable aqueous medium that can also include commercial surfactants, anti-foaming agents, dispersing agents, anti-corrosive agents, and optionally pigments and water-miscible organic solvents.

Still other useful polymeric binders can be homogenous, that is, film-forming, non-particulate, or dissolvable in the coating solvent. Such polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033A1 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), and U.S. Pat. No. 6,893,797 (Munnelly et al.), the disclosures of which are all incorporated herein by reference. Also useful are the vinyl carbazole polymers described in U.S. Pat. No. 7,175,949 (Tao et al.), and the polymers having pendant vinyl groups as described in U.S. Pat. No. 7,279,255 (Tao et al.), the disclosures of both patents being incorporated herein by reference. Useful are random copolymers derived from polyethylene glycol methacrylate/acrylonitrile/styrene monomers in random fashion and in particulate form, dissolved random copolymers derived from carboxyphenyl methacrylamide/acrylonitrile/-methacrylamide/N-phenyl maleimide, random copolymers derived from polyethylene glycol methacrylate/acrylonitrile/vinyl carbazole/styrene/-methacrylic acid, random copolymers derived from N-phenyl maleimide/methacrylamide/methacrylic acid, random copolymers derived from urethane-acrylic intermediate A (the reaction product of p-toluene sulfonyl isocyanate and hydroxylethyl methacrylate)/actylonitrile/N-phenyl maleimide, and random copolymers derived from N-methoxymethyl methacrylamide/-methacrylic acid/acrylonitrile/n-phenylmaleimide. By "random" copolymers, we mean the conventional use of the term, that is, the structural units in the polymer backbone that are derived from the monomers are arranged in random order as opposed to being block copolymers, although two or more of the same structural units can be in a chain incidentally.

The polymeric binders can be selected from any alkaline solution soluble (or dispersible) polymer having an acid value of at least 20 meq KOH/g of polymer and up to and including 400 meq KOH/g of polymer. The following described polymeric binders are useful in the manner but this is not an exhaustive list:

I. Film-forming polymers formed by polymerization of a combination or mixture of (a) (meth)acrylonitrile, (b) poly(alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.) the disclosure of which is incorporated herein by reference. Some particularly useful polymeric binders in this class are derived from one or more (meth)acrylic acids, (meth)acrylate esters, styrene and its derivatives, vinyl carbazoles, and poly(alkylene oxide) (meth)acrylates.

II. Film-forming polymers having pendant allyl ester groups as described in U.S. Pat. No. 7,332,253 (Tao et al.) the disclosure of which is incorporated herein by reference. Such polymers can also include pendant cyano groups or have recurring units derived from a variety of other monomers as described in Col. 8, line 31 to Col. 10, line 3 of the noted patent.

III. Film-forming polymers having all carbon backbones wherein at least 40 mol % and up to and including 100 mol % (and typically at least 40 and up to and including 50 mol %) of the carbon atoms forming the all carbon backbones are tertiary carbon atoms, and the remaining carbon atoms in the all carbon backbone being non-tertiary carbon atoms. Such polymeric binders are described in more detail in U.S. Patent Application Publication 2008-0280229 (Tao et al.), the disclosure of which is incorporated herein by reference.

IV. Film-forming, polymeric binders that have one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group that is not particularly limited. The reactive vinyl groups can be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.) the disclosure of which is incorporated herein by reference. Other useful polymeric binders have vinyl groups in pendant groups that are described, for example in EP 1,182,033A1 (Fujimaki et al.) and U.S. Pat. No. 4,874,686 (Urabe et al.), U.S. Pat. No. 7,729,255 (Tao et al.), U.S. Pat. No. 6,916,595 (Fujimaki et al.), and U.S. Pat. No. 7,041,416 (Wakata et al.) the disclosures of which are all incorporated by reference, especially with respect to the general formulae (1) through (3) noted in EP 1,182,033A1.

V. Film-forming polymeric binders can have pendant 1H-tetrazole groups as described in U.S. Patent Application Publication 2009-0142695 (Baumann et al.) the disclosure of which is incorporated herein by reference.

VI. Still other useful polymeric binders can be film-forming or exist as discrete particles and include but are not limited to, (meth)acrylic acid and acid ester resins [such as (meth) acrylates], polyvinyl acetals, phenolic resins, polymers derived from styrene, N-substituted cyclic imides or maleic anhydrides, such as those described in EP 1,182,033 (noted above) and U.S. Pat. No. 6,309,792 (Hauck et al.), U.S. Pat. No. 6,352,812 (Shimazu et al.), U.S. Pat. No. 6,569,603 (noted above), and U.S. Pat. No. 6,893,797 (Munnelly et al.) the disclosures of which are all are incorporated herein by reference. Also useful are the vinyl carbazole polymers described in U.S. Pat. No. 7,175,949 (Tao et al.) the disclosure of which is incorporated herein by reference. Other useful polymeric binders are particulate polyurethane-acrylic) hybrids that are distributed (usually uniformly) throughout the imageable layer. Each of these hybrids has a molecular weight ($M_n$) of at least 50,000 and up to and including 500,000 and the particles have an average particle size of at least 10 nm and up to and including 10,000 nm (typically at least 30 nm and up to and including 500 nm), as determined by Gel Permeation Chromatography.

The total polymeric binders are generally present in the negative-working imageable layer an amount of at least 5 weight % and up to and including 70 weight %, or typically at least 40 weight % and up to and including 70 weight %, of the total dry layer weight.

The radiation-sensitive composition (and negative-working imageable layer) comprises one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

Free radically polymerizable components include urea urethane (meth)acrylates or urethane (meth)acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, N.Y., 1992, pp. 399-440, and in "Polymer Imaging" by A. B. Cohen and P. Walker, in *Imaging Processes and Material*, J. M. Sturge et al. (Eds.), Van Nostrand Reinhold, N.Y., 1989, pp. 226-262. For example, useful free radically polymerizable components are also described in EP 1,182,033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.) the disclosures of all are incorporated herein by reference. Other useful free radically polymerizable components include those described in U.S. Patent Application Publication 2009/0142695 (Baumann et al.), which radically polymerizable components include 1H-tetrazole groups, and the disclosure of which publication is incorporated herein by reference.

In addition to, or in place of the free radically polymerizable components described above, the radiation-sensitive composition can include polymeric materials that include side chains attached to the backbone, which side chains include one or more free radically polymerizable groups (such as ethylenically unsaturated groups) that can be polymerized (crosslinked) in response to free radicals produced by the initiator composition (described below). There can be at least two of these side chains per molecule. The free radically polymerizable groups (or ethylenically unsaturated groups) can be part of aliphatic or aromatic acrylate side chains attached to the polymeric backbone. Generally, there are at least 2 and up to and including 20 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

The radiation-sensitive composition (negative-working imageable layer) also includes an initiator composition that includes one or more initiators that are capable of generating free radicals sufficient to initiate polymerization of all the various free radically polymerizable components upon exposure of the composition to imaging radiation. The initiator composition is generally responsive, for example, to electromagnetic radiation in the desired spectral regions, for example in the broad infrared spectral range of at least 700 nm and up to and including 1400 nm, or typically radiation of at least 700 nm and up to and including 1250 nm. Alternatively, the initiator composition can be responsive to exposing radiation in the violet region of at least 250 nm and up to and including 450 nm and typically of at least 350 nm and up to and including 450 nm.

More typically, the initiator composition includes one or more electron acceptors and one or more co-initiators that are capable of donating electrons, hydrogen atoms, or a hydrocarbon radical.

In general, suitable initiator compositions for radiation-sensitive compositions comprise initiators that include but are not limited to, aromatic sulfonylhalides, trihalogenomethylsulfones, imides (such as N-benzoyloxy-phthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diacetic acid and derivatives thereof and other "co-initiators"

described in U.S. Pat. No. 5,629,354 of West et al.), oxime ethers and oxime esters (such as those derived from benzoin), α-hydroxy or α-amino-acetophenones, trihalogenomethylarylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), trihalomethyl substituted triazines, boron-containing compounds (such as tetraarylborates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts).

Hexaarylbiimidazoles, onium compounds, and thiol compounds as well as mixtures of two or more thereof are desired co-initiators or free radical generators, and especially hexaarylbiimidazoles and mixtures thereof with thiol compounds are useful. Suitable hexaarylbiimidazoles are also described in U.S. Pat. No. 4,565,769 (Dueber et al.) and U.S. Pat. No. 3,445,232 (Shirey) and can be prepared according to known methods, such as the oxidative dimerization of triarylimidazoles.

Useful initiator compositions for IR radiation-sensitive compositions include onium compounds (salts) including ammonium, sulfonium, iodonium, and phosphonium compounds, particularly in combination with cyanine infrared radiation-sensitive dyes. Useful iodonium cations are well known in the art including but not limited to, U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.), the disclosures of all of which are incorporated herein by reference. For example, a useful iodonium cation includes a positively charged iodonium, (4-methylphenyl)[4-(2-methylpropyl)phenyl]-moiety and a suitable negatively charged counterion.

Thus, the iodonium cations can be supplied as part of one or more iodonium salts, and the iodonium cations can be supplied as iodonium borates also containing suitable boron-containing anions particularly in combination with cyanine infrared radiation-sensitive dyes. For example, the iodonium cations and the boron-containing anions can be supplied as part of substituted or substituted diaryliodonium salts that are combinations of Structures (I) and (II) described in Cols. 6-8 of U.S. Pat. No. 7,524,614 (Tao et al.) the disclosure of which is incorporated herein by reference.

Useful infrared radiation-sensitive initiator compositions can comprise one or more diaryliodonium borate compounds. Representative iodonium borate compounds useful in this invention include but are not limited to, 4-octyloxy-phenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexyl-phenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl) phenyl]borate, 4-methoxyphenyl-4'-cyclohexyl-phenyliodonium tetrakis(penta-fluorophenyl)borate, 4-methylphenyl-4'-dodecylphenyliodonium tetrakis(4-fluorophenyl)borate, bis(dodecylphenyl)-iodonium tetrakis(pentafluorophenyl)-borate, and bis(4-t-butylphenyl)iodonium tetrakis(1-imidazolyl)borate. Useful compounds include bis (4-t-butylphenyl)-iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition. U.S. Pat. No. 8,043, 787 (Hauck et al.) the disclosure of which is incorporated herein by reference with respect to useful initiator compositions, describes particularly diaryliodonium initiator compositions containing boron-containing anions.

Thus, in some embodiments, the initiator composition that is capable of generating free radicals upon exposure to imaging radiation comprises a diaryliodonium cation and a boron-containing anion, wherein the diaryliodonium cation is represented by the following Structure (I):

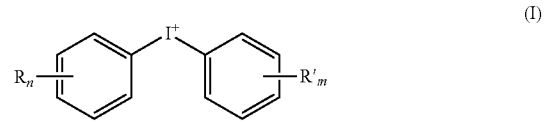

(I)

wherein R and R' independently represent halogen, nitro, alkyl, aryl, cycloalkyl, alkoxy, aryloxy, alkenyl, alkynyl, alkylamino, alkylamido, arylamido, carbonyl, carboxy, sulfonyl, thioalkyl, or thioaryl groups, or two or more of the R and R' groups can be combined to form a fused carbocyclic or heterocyclic ring with respective phenyl groups, and n and m are independently 0 or integers from 1 to 5. The sum of m and n can be 1 to 6.

The boron-containing anion is represented by the following Structure (II):

$B^-(R^1)(R^2)(R^3)(R^4)$ (II)

wherein $R^1$, $R^2$, $R^3$, and $R^4$ independently represent alkyl, aryl, alkenyl, alkynyl, cycloalkyl, or heterocyclic groups, or two or more of $R^1$, $R^2$, $R^3$, and $R^4$ can be joined together to form a heterocyclic ring with the boron atom, such rings having up to 7 carbon, nitrogen, oxygen, or nitrogen atoms. In some embodiments, all of the $R^1$, $R^2$, $R^3$, and $R^4$ are the same or different substituted or unsubstituted aryl groups such as substituted or unsubstituted phenyl groups, or more likely all of these groups are unsubstituted phenyl groups, and the sum of m and n can be 1 to 6.

The amount of initiator composition in the negative-working imageable layer would be readily apparent to one skilled in the art and would be dependent upon the particular radiation-sensitive composition to be used.

The negative-working imageable layers comprise a radiation-sensitive imaging composition that includes one or more radiation absorbing compounds such as infrared radiation absorbers or one or more UV sensitizers. The total amount of one or more radiation absorbing compounds is at least 1 weight % and up to and including 30 weight %, or typically at least 5 weight % and up to and including 20 weight %, based on the negative-working imageable layer total solids.

In some embodiments, the radiation-sensitive composition contains a UV sensitizer as a radiation absorbing compound when the free-radical generating compound is UV radiation sensitive (that is at least 250 nm and up to and including 450 nm), thereby facilitating photopolymerization. Thus, in other embodiments, the radiation sensitive compositions are sensitized to "violet" radiation in the range of at least 350 nm and up to and including 450 nm. Useful sensitizers for such compositions include certain pyrilium and thiopyrilium dyes and 3-ketocoumarins. Some other useful sensitizers for such spectral sensitivity are described for example, in U.S. Pat. No. 6,908,726 (Korionoff et al.) and WO 2004/074929 (Baumann et al.) that describes useful bisoxazole derivatives and analogues, and U.S. Patent Application Publications 2006/0063101 and 2006/0234155 (both Baumann et al.), the disclosures of which are incorporated herein by reference.

Still other useful sensitizers are the oligomeric or polymeric compounds having Structure (I) units defined in WO 2006/053689 (Strehmel et al.) that have a suitable aromatic or heteroaromatic unit that provides a conjugated π-system between two heteroatoms.

Additional useful "violet"-visible radiation absorbing compounds are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

Other useful radiation absorbing compounds for the violet region of sensitization are the 2,4,5-triaryloxazole derivatives as described in WO 2004/074930 (Baumann et al.). These compounds can be used alone or with a co-initiator as described above. Useful 2,4,5-triaryloxazole derivatives can be represented by the Structure G-$(Ar_1)_3$ wherein $Ar_1$ is the same or different, substituted or unsubstituted carbocyclic aryl group having 6 to 12 carbon atoms in the ring, and G is a furan or oxazole ring, or the Structure G-$(Ar_1)_2$ wherein G is an oxadiazole ring. The $Ar_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more $R'_1$ through $R'_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups) substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a —$N(R'_4)(R'_5)$ group, or a —$OR'_6$ group wherein $R'_4$ through $R'_6$ independently represent substituted or unsubstituted alkyl or aryl groups as defined above. At least one of $R'_1$ through $R'_3$ is an —$N(R'_4)(R'_5)$ group wherein $R'_4$ and $R'_5$ are the same or different alkyl groups. Useful substituents for each $Ar_1$ group include the same or different primary, secondary, and tertiary amines.

Still another class of useful violet radiation sensitizers includes compounds represented by the Structure $Ar_1$-G-$Ar_2$ wherein $Ar_1$ and $Ar_2$ are the same or different substituted or unsubstituted aryl groups having 6 to 12 carbon atoms in the ring, or $Ar_2$ can be an arylene-G-$Ar_1$ or arylene-G-$Ar_2$ group, and G is a furan, oxazole, or oxadiazole ring. $Ar_1$ is the same as defined above, and $Ar_2$ can be the same or different aryl group as $Ar_1$. "Arylene" can be any of the aryl groups defined for $Ar_1$ but with a hydrogen atom removed to render them divalent in nature.

Some useful infrared radiation absorbing compounds are sensitive to both infrared radiation (typically of at least 700 nm and up to and including 1400 nm) and visible radiation (typically of at least 450 nm and up to and including 700 nm). These compounds also have a tetraaryl pentadiene chromophore. Such chromophore generally includes a pentadiene linking group having 5 carbon atoms in the chain, to which are attached two substituted or unsubstituted aryl groups at each end of the linking group. These aryl groups can be substituted with the same or different tertiary amine groups. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain. Other details of such compounds are provided in U.S. Pat. No. 7,429,445 (Munnelly et al.) the disclosure of which is incorporated herein by reference.

Other useful infrared radiation absorbing compounds include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyryloarylidene and bi(chalcogenopyrylo)polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (noted above), U.S. Pat. No. 6,787,281 (Tao et al.), U.S. Pat. No. 7,135,271 (Kawaushi et al.), and EP 1,182,033A2 (noted above), the disclosures of all of which are incorporated herein by reference. Infrared radiation absorbing N-alkylsulfate cyanine dyes are described for example in U.S. Pat. No. 7,018,775 (Tao) the disclosure is incorporated herein by reference. A general description of one class of suitable cyanine dyes is shown by the formula in paragraph [0026] of WO 2004/101280 (Munnelly et al.).

In addition to low molecular weight IR-absorbing dyes having IR dye chromophores bonded to polymers can be used as well. Moreover, IR dye cations can be used as well, that is, the cation is the IR absorbing portion of the dye salt that conically interacts with a polymer comprising carboxy, sulfo, phospho, or phosphono groups in the side chains.

Near infrared absorbing cyanine dyes are also useful and are described for example in U.S. Pat. No. 6,309,792 (noted above), U.S. Pat. No. 6,264,920 (Achilefu et al.), U.S. Pat. No. 6,153,356 (noted above), and U.S. Pat. No. 5,496,903 (Watanabe et al.), the disclosures of which are incorporated herein by reference. Suitable dyes can be formed using conventional methods and starting materials or obtained from various commercial sources including American Dye Source (Baie D'Urfe, Quebec, Canada) and FEW Chemicals (Germany). Other useful dyes for near infrared diode laser beams are described in U.S. Pat. No. 4,973,572 (DeBoer).

Useful IR-radiation sensitive compositions are also described, for example, in U.S. Pat. No. 7,452,638 (Yu et al.), and U.S. Patent Application Publications 2008/0254387 (Yu et al.), 2008/0311520 (Yu et al.), 2009/0263746 (Ray et al.), and 2010/0021844 (Yu et al.) the disclosures of all of which are incorporated herein by reference.

Thus, the radiation absorbing compound can be an infrared radiation absorber and the negative-working imageable layer is sensitive to infrared radiation in many embodiments. In other embodiments, the radiation absorbing compound is sensitive to UV (violet) radiation and renders the negative-working imageable layer sensitive in this manner also.

The negative-working imageable layer can also include a poly(alkylene glycol) or an ether or ester thereof that has a molecular weight of at least 200 and up to and including 4000. The imageable layer can further include a poly(vinyl alcohol), a poly(vinyl pyrrolidone), poly(vinyl imidazole), or polyester in an amount of up to and including 20 weight % based on the total dry weight of the imageable layer.

Additional additives to the negative-working imageable layer include color developers or acidic compounds. Color developers are meant to include monomeric phenolic compounds, organic acids or metal salts thereof, oxybenzoic acid esters, acid clays, and other compounds described for example in U.S. Patent Application Publication 2005/0170282 (Inno et al.). The imageable layer can also include a variety of optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. The negative-working imageable layer also optionally includes a phosphate (meth) acrylate having a molecular weight generally greater than 250 as described in U.S. Pat. No. 7,429,445 (Munnelly et al.) the disclosure of which is incorporated herein by reference.

Outermost Water-Soluble Overcoat Layer

The precursor has an outermost water-soluble overcoat layer disposed directly on the negative-working imageable layer. This outermost water-soluble overcoat layer is the outermost layer of the precursor and thus, when stacked with other precursors, this outermost layer of one precursor would be in contact with the backside of the substrate of the adjacent precursor above it.

Such outermost water-soluble overcoat layers comprises one or more film-forming water-soluble polymeric binders in an amount of at least 60 weight % and up to and including 98 weight %, based on the total dry weight of the outermost water-soluble overcoat layer.

Such film-forming water-soluble polymeric binders generally include a modified or unmodified poly(vinyl alcohol) having a saponification degree of at least 30%, or a degree of at least 75%, or a degree of at least 90%, and a degree of up to and including 99.9%.

For example, the outermost water-soluble overcoat layer can include one or more film-forming water-soluble polymeric binders that comprise at least one modified poly(vinyl alcohol) that is modified with at least 0.1 mol % of one or more of the same or different groups selected from the group consisting of carboxylic acid, sulfonic acid, acetoacetyl, alkylene, silanol, amino, thioalkyl, glycol, sulfuric acid ester, phosphonic acid, and phosphoric acid ester groups.

Further, one or more acid-modified poly(vinyl alcohol)s can be used as film-forming water-soluble polymeric binders in the outermost water-soluble overcoat layer. For example, at least one modified poly(vinyl alcohol) can be modified with an acid group selected from the group consisting of carboxylic acid, sulfonic acid, sulfuric acid ester, phosphonic acid, and phosphoric acid ester groups. Examples of such materials include but are not limited to, sulfonic acid-modified poly (vinyl alcohol), carboxylic acid-modified poly(vinyl alcohol), and quaternary ammonium salt-modified poly(vinyl alcohol), or combinations thereof. Specific commercial examples of the acid-modified poly(vinyl alcohol) include SD1000 that is available from Kuraray, and Gohsefimer K-210, Gohseran L-3266 and Gohseran CKS-50 that are available from Nippon Gohsei.

The outermost water-soluble overcoat layer can further comprise one or more other film-forming water-soluble polymers that are not poly(vinyl alcohol)s for example in an amount of at least 2 weight % and up to and including 40 weight %, of a poly(vinyl pyrrolidone), poly(ethyleneimine), poly(vinyl imidazole), poly(vinyl caprolactone), or a random copolymer derived from two or more of vinyl pyrrolidone, ethyleneimine, vinyl caprolactone, vinyl acetate, and vinyl imidazole, and vinyl acetamide.

Alternatively, the outermost water-soluble overcoat layer can be formed predominantly using one or more of film-forming water-soluble polymeric binders such as poly(vinyl pyrrolidone), poly(ethyleneimine), poly(vinyl imidazole), gelatin or a gelatin derivative, cellulose derivatives, and random copolymers from two or more of vinyl pyrrolidone, ethyleneimine and vinyl imidazole, and mixtures of such polymers.

The outermost water-soluble overcoat layer formulations can also include cationic, anionic, amphoteric, and non-ionic wetting agents or surfactants, flow improvers or thickeners, antifoamants, colorants, and biocides. Details about such addenda and useful amounts are provided in WO 99/06890 (Pappas et al.), EP 1,788,429 (Loccufier et al.), and U.S. Patent Application Publications 2005/0266349 (Van Damme et al.), 2007/0231739 (Koizumi), 2007/0231740 (Yanaka et al.), and 2011/0053085 (Huang et al.), the disclosures of which are incorporated herein by reference.

The dry thickness (t) of the outermost water-soluble overcoat layer can be defined by the following equation (I):

$$t = w/r$$

wherein w is the dry coverage of the outermost water-soluble overcoat layer in $g/m^2$, and r is the density of the outermost water-soluble overcoat layer in $g/cm^3$ that is considered to be 1 $g/cm^3$. In many embodiments, the dry thickness (t) of the outermost water-soluble overcoat layer is at least is at least 0.05 µm and up to and including 4 µm or more typically at least 0.1 µm and up to and including 2 µm.

The outermost water-soluble overcoat layer is generally present at a dry coating coverage of at least 0.1 $g/m^2$ and up to but less than 4 $g/m^2$, and typically at a dry coating coverage of at least 0.15 $g/m^2$ and up to and including 2.5 $g/m^2$. In some embodiments, the dry coating coverage is at least 0.1 $g/m^2$ and up to and including 1.5 $g/m^2$ or at least 0.1 $g/m^2$ and up to and including 0.9 $g/m^2$, such that the outermost water-soluble overcoat layer is relatively thin for removal during on-press development, or during off-press development when a separate prewash step is omitted. The present invention is most advantageous for the thinner outermost water-soluble overcoat layers where the dry coating coverage is at least 0.2 $g/m^2$ and up to and including 1.5 $g/m^2$.

The outermost water-soluble overcoat layer comprises organic wax particles dispersed, generally uniformly, within the one or more film-forming water-soluble polymeric binders. These organic wax particles are generally present in an amount of at least 0.05 weight % and up to and including 20 weight %, or in an amount of at least 0.5 weight % and up to and including 10 weight %, all based on the total dry outermost water-soluble overcoat layer weight.

These organic wax particles generally have an average largest dimension D(wax) (for example, average diameter if generally spherical in shape, or an equivalent circular diameter, ECD if irregular in shape) that is less than 0.9 of t (in µm), or less than 90% of the t dimension. In many embodiments, the organic wax particles have an average largest dimension D(wax) that is defined by the following equation (III):

$$0.06 \text{ times } t \leq D(\text{wax}) < 0.75 \text{ times } t \text{ (in } \mu m\text{)}.$$

In many embodiments, the organic wax particles have an average largest dimension of at least 0.08 μm and up to and including 0.8 μm, or typically of at least 0.1 μm and up to and including 0.5 μm, as long as the requirement of equation (I) noted above is met.

The organic wax particles generally have a melting temperature of at least 100° C. and up to and including 180° C., and typically of at least 115° C. and up to and including 150° C. These organic wax particles can comprise fluorinated or non-fluorinated hydrocarbons including but not limited to, fluorinated and non-fluorinated polyolefins, such as low density polyethylene, high density polyethylene, polypropylene, polytetrafluoroethylene, or mixtures thereof. High density and low density polyethylene wax particles and polytetrafluoroethylene are particularly useful.

Useful organic wax particles can be prepared using known procedures as described for example, in WO96/010599 (Soler Codina) and U.S. Ser. No. 13/482,151 (noted above), the disclosure of which US application is incorporated herein by reference. Some useful fluorinated and non-fluorinated hydrocarbon wax particles can also be purchased from a number of commercial sources such as Mitsui Chemical Inc. or Münzing Liquid Technologies GmbH.

The outermost water-soluble overcoat layer further comprises non-wax matte particles, wherein the non-wax matte particles have an average largest dimension (or diameter if spherical), D(matte), which is defined by the following equation (II):

$$1.5 \text{ times } t \leq D(\text{matte}) \leq 40 \text{ times } t \text{ (in } \mu m\text{)}$$

wherein t is as defined above by equation (I).

However, it many embodiments, D(matte) can be defined by the following equation (IV):

$$2 \text{ times } t \leq D(\text{matte}) \leq 25 \text{ times } t \text{ (in } \mu m\text{)}$$

wherein t is as defined above by equation (I).

For example, D(matte) is generally at least 1 μm and up to and including 15 μm, as long as the requirements of equation (II) are met.

The D(matte) is determined as an average of the largest dimension of 10 individual non-wax matte particles in the outermost water-soluble overcoat layer using SEM images at 625× magnification.

The non-wax matte particles are generally present in the outermost water-soluble overcoat layer in an amount of at least 0.2 weight % and up to and including 20 weight %, or typically of at least 0.5 weight % and up to and including 5 weight %, based on the total dry outermost water-soluble overcoat layer weight.

Useful non-wax matte particles can be composed of various inorganic or organic polymeric materials (that are not waxes as defined herein). In many embodiments, the non-wax matte particles are crosslinked organic particles such as crosslinked organic polymeric particles, core-shell polymeric particles, organic particles inorganic modifications (functional groups) on the outer surface, inorganic particles, and inorganic particles having outer surfaces modified with hydrophobic or hydrophilic organic materials.

Useful inorganic non-wax matte particles include but are not limited to, crosslinked core-shell polymeric particles as described for example in U.S. Patent Application Publication 2011/0053085 (Huang et al.) the disclosure of which is incorporated herein by reference. Such crosslinked core-shell polymeric particles can be prepared to have crosslinked polymeric cores that are prepared using emulsion polymerization of various ethylenically unsaturated polymerizable monomers including one or more monomers having crosslinkable moieties such as divinyl benzene, and shells composed of grafted hydrophilic surface groups provided from suitable hydrophilic ethylenically unsaturated polymerizable monomers.

Other useful non-wax matte particles are described in U.S. Pat. No. 8,105,751 (Endo) the disclosure of which is incorporated herein by reference. The described non-wax matte particles are silica-coated resin particles, for example having organic resin cores and silica layers forming shells on the cores. The preparation of such silica-coated resin particles are also described in the noted publication.

The organic non-wax matte particles can be crosslinked to prevent dissolution in coating solvents. Spherical particles with a uniform particle size or particles having a narrow size distribution are particularly useful. Examples of such particles include those particles commercially available from Sekisui Plastics. Co., Ltd., for example, crosslinked poly(methyl methacrylate) particles (such as those known as MBX-5, MBX-8, MBX-12, MB20X-5, MB30x-5, MB30X-8, MBP-8, SSX-101, SSX-103, SSX-105, SSX-108, SSX-110, and SSX-115 products), crosslinked poly(acrylic acid) particles (such as ARX-15 product), crosslinked poly(styrene) particles (such as SBX-6, SBX8, and SBX-12 products), crosslinked poly(butyl methacrylate) particles (such as BM30X-5, BM30X-8, and BM30X-12 products), and particles of crosslinked copolymers of methyl methacrylate and styrene (such as MSX and SMX products).

Similar products are available from Soken Chemical Engineering Co., Ltd. such as the MX-series particles (monodisperse crosslinked acrylic particles having a 1.5 μm to 30 μm particle size), and SX-series particles (monodisperse crosslinked poly(styrene) particles having particles sizes between 3.5 μm and 5 μm).

Additional examples of organic non-wax matte particles include water dispersions of polyolefins current available from Mitsui Chemicals. Co., Ltd. (such as Chemipearl V100, Chemipearl V200, Chemipearl V300, Chemipearl A100 and Chemipearl A400 products) and SDY 70 product currently available from Eastman Kodak Company, which include 6 μm beads of poly(styrene-co-divinyl benzene) that are coated with smaller silica particles.

Particularly useful organic non-wax matte particles include those commercially available as SSX-105 that include Medium-Crosslinked poly(methyl methacrylate) beads with 5 μm diameter and 1.2 g/cm$^3$ density.

In some preferred embodiments, the outermost water-soluble overcoat layer consists essentially of the one or more film-forming water-soluble polymeric binders, at least one of which is an acid-modified poly(vinyl alcohol) or a poly(vinyl alcohol) having a saponification degree of at least 70%, polyethylene wax particles or polytetrafluoroethylene organic wax particles, and at least 1 weight % and up to and including 5 weight % non-wax matte particles. The organic wax particles have a D(wax) of at least 0.1 μm and up to and including 0.5 μm, and the non-wax matte particles have a D(matte) of at least 1 μm and up to and including 15 μm.

Negative-Working Lithographic Printing Plate Precursors

The negative-working radiation-sensitive compositions described above can be applied to a substrate as a solution or dispersion in a coating liquid using any suitable equipment and procedure, such as spin coating, knife coating, gravure coating, die coating, slot coating, bar coating, wire rod coating, roller coating, or extrusion hopper coating. The radiation-sensitive composition can also be applied by spraying onto a suitable support. Typically, the radiation-sensitive composition is applied and dried to form a negative-working imageable layer.

Illustrative of such manufacturing methods is mixing the various components needed for the imaging chemistry in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imageable layer formulations are described in the invention Examples below. After proper drying, the coating weight of the negative-working imageable layer is generally at least 0.1 $g/m^2$ and up to and including 5 $g/m^2$ or at least 0.5 $g/m^2$ and up to and including 3.5 $g/m^2$.

Layers can also be present under the negative-working imageable layer to enhance developability or to act as thermal insulating layers.

A suitable outermost water-soluble overcoat layer formulation (as described above) can be applied to a dried negative-working imageable layer in a suitable manner, generally out of an aqueous solvent, and then dried as described below.

Once the various layers have been applied and dried on the substrate, the negative-working lithographic printing plate precursors can be enclosed in water-impermeable material that substantially inhibits the transfer of moisture to and from the element and "heat conditioned" as described in U.S. Pat. No. 7,175,969 (noted above) the disclosure of which is incorporated herein by reference.

The lithographic printing plate precursors can be stored and transported as stacks of precursors within suitable packaging and containers known in the art, and interleaf papers can be omitted from between the adjacent precursors in the stacks.

Imaging Conditions

During use, the lithographic printing plate precursor is exposed to a suitable source of exposing radiation depending upon the radiation absorber present in the radiation-sensitive composition to provide specific sensitivity that is at a wavelength of at least 150 nm and up to and including 450 nm ("UV" or "violet") or infrared of at least 700 nm and up to and including 1400 nm. In some embodiments, imagewise exposure is carried out using radiation having a $\lambda_{max}$ within the range of at least 350 nm and up to and including 450 nm when the negative-working lithographic printing plate precursor is sensitive to UV or "violet" radiation, or using radiation having a $\lambda_{max}$ within the range of at least 700 nm and up to and including 1400 nm using an appropriate energy source when the negative-working lithographic printing plate precursor is sensitive to infrared radiation.

For example, imaging can be carried out using imaging or exposing radiation from a radiation-generating laser (or array of such lasers). Imaging also can be carried out using imaging radiation at multiple wavelengths at the same time if desired. The laser used to expose the lithographic printing plate precursor is usually a diode laser, because of the reliability and low maintenance of diode laser systems, but other lasers such as gas or solid-state lasers can also be used. The combination of power, intensity and exposure time for laser imaging would be readily apparent to one skilled in the art.

The imaging apparatus can be configured as a flatbed recorder or as a drum recorder, with the lithographic printing plate precursor mounted to the interior or exterior cylindrical surface of the drum. An example of an useful imaging apparatus is available as models of Kodak® Trendsetter platesetters available from Eastman Kodak Company that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen USA, Chicago, Ill.) that operates at a wavelength of 810 nm.

Imaging with infrared radiation can be carried out generally at imaging energies of at least 30 $mJ/cm^2$ and up to and including 500 $mJ/cm^2$ and typically at least 50 $mJ/cm^2$ and up to and including 300 $mJ/cm^2$ depending upon the sensitivity of the imageable layer. With these platesetters, any imaging parameters such as the "surface depth" parameter of a Magnus 800 platesetter (Eastman Kodak Company) or the "focus" parameter of a PlateRite 4300 platesetter (Dainippon Screen Company), are decided by observing the difference in contrast between exposed regions and non-exposed regions in a stepwise imaging process. By using such as stepwise imaged lithographic printing plate precursor, a shortened printing run is possible and the obtained prints are also useful for determining such imaging parameters.

Useful UV and "violet" imaging apparatus include Prosetter (from Heidelberger Druckmaschinen, Germany), Luxel V-8 (from FUJI, Japan), Python (Highwater, UK), MakoNews, Mako 2, Mako 4 or Mako 8 (from ECRM, US), Micra (from Screen, Japan), Polaris and Advantage (from AGFA, Belgium), Laserjet (from Krause, Germany), and Andromeda® A750M (from Lithotech, Germany), imagesetters.

Imaging radiation in the UV to visible region of the spectrum, and particularly the UV region (for example at least 150 nm and up to and including 475 nm), can be carried out generally using energies of at least 0.01 $mJ/cm^2$ and up to and including 0.5 $mJ/cm^2$, and typically at least 0.02 $mJ/cm^2$ and up to and including about 0.1 $mJ/cm^2$. It would be desirable, for example, to image the UV/visible radiation-sensitive precursors at a power density in the range of at least 0.5 $kW/cm^2$ and up to and including 50 $kW/cm^2$ and typically of at least 5 $kW/cm^2$ and up to and including 30 $kW/cm^2$, depending upon the source of energy (violet laser or excimer sources).

While laser imaging is desired in the practice of this invention, thermal imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

After imaging, the imaged negative-working lithographic printing plate precursors can be processed "off-press" using a suitable processing solution described herein, for example using water or a processing solution as described below. Such processing is carried out with imaged negative-working precursors for a time sufficient to remove the non-exposed regions of the imaged negative-working imageable layer and outermost water-soluble overcoat layer to reveal the hydrophilic surface of the substrate, but not long enough to remove significant amounts of the exposed regions that have been hardened. The revealed hydrophilic substrate surface repels inks while the exposed regions accept ink. Thus, the non-exposed regions to be removed are "soluble" or "removable" in the processing solution because they are removed, dissolved, or dispersed within it more readily than the regions that are to remain. The term "soluble" also means "dispersible".

Development off-press can be accomplished using what is known as "manual" development, "dip" development, or processing with an automatic development apparatus (processor). In the case of "manual" development, development is conducted by rubbing the entire imaged precursor with a sponge or cotton pad sufficiently impregnated with a suitable processing solution or developer (described below), and followed by rinsing with water. "Dip" development involves dipping the imaged precursor in a tank or tray containing the appropriate developer for at least 10 seconds and up to and including 60 seconds (especially at least 20 seconds and up to and including 40 seconds) under agitation, followed by rinsing with water with or without rubbing with a sponge or cotton pad. The use of automatic development apparatus is well known and generally includes pumping a developer or processing solution into a developing tank or ejecting it from spray nozzles. The imaged precursor is contacted with the developer in an appropriate manner. The apparatus can also include a suitable rubbing mechanism (for example a brush or roller) and a suitable number of conveyance rollers. Some developing apparatus include laser exposure means and the apparatus is divided into an imaging section and a developing section.

Both aqueous alkaline developers and organic solvent-containing developers or processing solutions can be used. Some useful developer solutions are described for example, in U.S. Pat. No. 7,507,526 (Miller et al.) and U.S. Pat. No. 7,316,894 (Miller et al.) that are incorporated herein by reference. Developer solutions can include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates).

Useful alkaline aqueous developer solutions include 3000 Developer, 9000 Developer, GOLDSTAR Developer, GREENSTAR Developer, ThermalPro Developer, PROTHERM Developer, MX1813 Developer, and MX1710 Developer (all available from Eastman Kodak Company)

Organic solvent-containing developers are generally single-phase processing solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of at least 0.5% and up to and including 15% based on total developer weight. The organic solvent-containing developers can be neutral, alkaline, or slightly acidic in pH, and typically, they are alkaline in pH. Representative organic solvent-containing developers include ND-1 Developer, Developer 980, Developer 1080, Developer 1090, 2 in 1 Developer, 955 Developer, D29 Developer (described below), Developer SP500, Developer 206, and 956 Developer (all available from Eastman Kodak Company).

In some useful embodiments of the method of this invention, the processing solution used for development has a pH of at least 3 and up to and including 13, and typically, the pH is at least 6 and up to and including 12.5 or at least 7.5 and up to and including 11.5. In addition, the processing solution can further comprise at least one compound selected from the group consisting of a nonionic surfactant, an anionic surfactant, a neutrally-charged hydrophilic compound other than a nonionic or anionic surfactant, and a hydrophilic film-forming polymer. The presence of a hydrophilic film-forming polymer (as described below) can be particularly useful in some developer solutions. Such processing solutions an also comprise one or more alkanolamines, organic solvents, organic phosphonic acids, or polycarboxylic acids or salts.

In some instances, an aqueous processing solution can be used to both develop the imaged precursor by removing the non-exposed regions of the negative-working imageable layer and also to provide a protective layer or coating over the entire imaged and developed (processed) precursor printing surface. In this embodiment, the aqueous alkaline solution behaves somewhat like a gum that is capable of protecting (or "gumming") the lithographic image on the printing plate against contamination or damage (for example, from oxidation, fingerprints, dust, or scratches). Such processing solutions generally have a pH of at least 2 and up to and including 11.5, and typically of at least 6 and up to and including 11, or of at least 6 and up to and including 10.5, as adjusted using a suitable amount of an acid or base. The aqueous processing solution generally includes a basic compound such as an organic amine having a boiling point of less than 300° C. (and typically of at least 50° C.) or an alkaline earth/alkali carbonate buffer or an amino acid buffer, a film-forming hydrophilic polymer, and optionally an anionic, amphoteric, or nonionic surfactant. The pH of the aqueous alkaline solution can be adjusted by adding a suitable amount of a alkaline component such as alkali silicates (including metasilicates), alkali metal hydroxides (such as sodium hydroxide and potassium hydroxide), and quaternary ammonium hydroxides. Tap water can be used to make up the solution and generally provides at least 45 and up to and including 98 weight % of the solution.

Useful organic amines are relatively volatile organic primary, secondary, and tertiary amines that include but are not limited to, alkanolamines (including cycloalkyl amines), carbocyclic aromatic amines, and heterocyclic amines, that are present in a total amount of at least 0.1 weight % and up to and including 50 weight %. Useful amines are mono-, di- and trialkanol amines such as monoethanolamine, diethanolamine, triethanolamine, and mono-n-propanolamine, or combinations of these compounds.

One or more film-forming water-soluble or hydrophilic compounds can be present in the processing solution in an amount of at least 0.25 weight % and up to and including 30 weight % and typically at least 1 weight % and up to and including 15 weight %. Examples of useful hydrophilic compounds of this type include hydrophilic polymers as well as non-polymeric hydrophilic compounds (molecular weight of less than 1,000) that are not nonionic or anionic surfactants. Useful non-polymeric and polymeric hydrophilic compounds include but are not limited to, gum arabic, gluconic acid, pullulan, cellulose derivatives (such as hydroxymethyl celluloses, carboxymethyl-celluloses, carboxyethylcelluloses, and methyl celluloses), starch derivatives [such as (cyclo) dextrins, starch esters, dextrins, carboxymethyl starch, and acetylated starch] poly(vinyl alcohol), poly(vinyl pyrrolidone), polyhydroxy compounds [such as polysaccharides, sugar alcohols such as sorbitol, miso-inosit, homo- and copolymers of (meth)acrylic acid or (meth)acrylamide], copolymers of vinyl methyl ether and maleic anhydride, copolymers of vinyl acetate and maleic anhydride, copolymers of styrene and maleic anhydride, and copolymers having recurring units with carboxy, sulfo, or phospho groups, or salts thereof.

The aqueous processing solution optionally includes one or more anionic, amphoteric, or nonionic surfactants (or both) in an amount of at least 0.25 weight % and up to and including 50 weight %, and typically at least 0.25 weight % and up to and including 30 weight %. They generally include one or more anionic surfactants, even though optional components (such as nonionic surfactants) can be present if desired. Useful anionic surfactants include those with carboxylic acid, sulfonic acid, or phosphonic acid groups (or salts thereof). Anionic surfactants having sulfonic acid (or salts thereof) groups are particularly useful. For example, such anionic surfactants can include salts of fatty acids, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxy-ethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylester, salts of alkylsulfuric esters, sulfuric esters of polyoxy-ethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhydride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary anionic surfactant. Such surfactants can be obtained from various suppliers as described in McCutcheon's Emulsifiers & Detergents, 2007 Edition.

Examples of useful nonionic surfactants include but are not limited to, polyoxyethylene alkyl ethers, polyoxyethylene phenyl ethers, polyoxyethylene 2-naphthyl ethers, polyoxyethylene alkyl phenyl ethers, polyoxyethylene polystyryl phenyl ethers, polyoxyethylene polyoxypropylene alkyl ethers, polyoxyethylene polyoxypropylene block polymers, partial esters of glycerinaliphatic acids, partial esters of sorbitanaliphatic acid, partial esters of pentaerythritolaliphatic acid, propyleneglycolmonoaliphatic esters, partial esters of sucrosealiphatic acids, partial esters of polyoxyethylenesorbitanaliphatic acid, partial esters of polyoxyethylenesorbitolaliphatic acids, polyethyleneglycol-aliphatic esters, partial esters of poly-glycerinaliphatic acids, poly-oxyethylenated castor oils, partial esters of polyoxyethyleneglycerinaliphatic acids, aliphatic diethanolamides, N,N-bis-2-hydroxyalkylamines, polyoxy-ethylene alkylamines, triethanolamine aliphatic esters, alkoxylated aromatic compounds and trialkylamine oxides. Particularly preferred among these nonionic surfactants are alkoxylated aromatic compounds like polyoxyethylene phenyl ethers, polyoxyethylene-2-naphthyl ethers as disclosed in EP 1,172,699A (Tsuchiya et al.), polyoxyethylene di-styryl phenyl ether and polyoxyethylene tri-styryl phenyl ether as disclosed in EP 1,722,275A (Giles et al.).

Useful amphoteric surfactants include but are not limited to, N-alkylamino acid triethanol ammonium salts, cocamidopropyl betaines, cocamidoalkyl glycinates, sodium salt of a short chain alkylaminocarboxylate, N-2-hydroxyethyl-N-2-carboxyethyl fatty acid amidoethylamine sodium salts, and carboxylic acid amidoetherpropionates; preferred are cocamidopropylbetaines.

Useful cationic surfactants include but are not limited to, tetraalkyl ammonium chlorides such as tetrabutyl ammonium chloride and tetramethyl ammonium chloride, and polypropoxylated quaternary ammonium chlorides.

Nonionic, anionic and amphoteric surfactants as well as mixtures thereof are particularly useful.

It is useful that the developer (or processing solution) used in the present invention comprises at least one member selected from surfactants and alkaline components.

Additional optional components of the aqueous processing solutions used in this invention include but are not limited to, antifoaming agents, buffers, biocides, complexing agents, and small amounts of water-miscible organic solvents such as reaction products of phenol with ethylene oxide and propylene oxide, benzyl alcohol, esters of ethylene glycol and propylene glycol with acids having 6 or less carbon atoms, sludge inhibitors (such as filter dyes and free-radical inhibitors), odorants, anti-corrosion agents, and dyes.

The processing solution (or developer) can be applied to an imaged precursor by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the outer layer with the processing solution or contacting it with a roller, impregnated pad, or applicator. For example, the imaged precursor can be brushed with the processing solution, or it can be poured onto or applied by spraying the imaged surface with sufficient force to remove the non-exposed regions using a spray nozzle system as described for example in [0124] of EP 1,788,431A2 (noted above) and U.S. Pat. No. 6,992,688 (Shimazu et al.) as incorporated herein by reference. As noted above, the imaged precursor can be immersed in the processing solution and rubbed by hand or with an apparatus. To assist in the removal of the back side coating, a brush roller or other mechanical component can be placed in contact with the back side coating during processing. Alternatively, the processing solution can be sprayed using a spray bar using a sufficient force.

The processing solution can also be applied in a processing unit (or station) in a suitable apparatus that has at least one roller for rubbing or brushing the imaged precursor while the processing solution is applied. Residual processing solution can be removed (for example, using a squeegee or nip rollers) or left on the resulting lithographic printing plate without any rinsing step. Excess processing solution can be collected in a tank and used several times, and replenished if necessary from a reservoir. The processing solution replenisher can be of the same concentration as that used in processing, or it can be provided in concentrated form and diluted with water at an appropriate time.

After such processing, the lithographic printing plate can be mounted onto a printing press without any post-processing step, such as rinsing, gumming, or post-processing curing or UV treatment.

In some embodiments, the imaged lithographic printing plate precursor can be processed as described above, but before mounting onto a printing press, the resulting lithographic printing plate can be further treated by rinsing with water, an aqueous solution, or other suitable solution, gumming, or drying, or any combination of these procedures. In addition, such imaged precursors can be pre-heated prior to the processing step.

Following off-press development, the resulting lithographic printing plate can be postbaked with or without blanket or floodwise exposure to UV or visible radiation. Alternatively, a blanket UV or visible radiation exposure can be carried out, without a postbake operation.

In some embodiments, there is no post-development rinsing or gumming, but the lithographic printing plates can be used for printing without these common steps.

Printing can be carried out by putting the imaged and developed lithographic printing plate on a suitable printing press. The lithographic printing plate is generally secured in the printing plate using suitable clamps or other holding devices. Once the lithographic printing plate is secured in the printing press, printing is carried out by applying a lithographic printing ink and fountain solution to the printing surface of the lithographic printing plate. The fountain solution is taken up by the surface of the hydrophilic substrate revealed by the imaging and processing steps, and the ink is taken up by the remaining regions of the imageable layer. The ink is then transferred to a suitable receiving material (such as cloth, paper, metal, glass, or plastic) to provide a desired impression of the image thereon. If desired, an intermediate "blanket" roller can be used to transfer the ink from the lithographic printing plate to the receiving material (for example, sheets of paper). The lithographic printing plates can be cleaned between impressions, if desired, using conventional cleaning means.

For the imaged negative-working lithographic printing plate precursors that are designed for on-press development, the imaged precursor is mounted on-press wherein the non-exposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The present invention provides at least the following embodiments and combinations thereof, but other combinations of features are considered to be within the present invention as a skilled artisan would appreciate from the teaching of this disclosure:

1. A negative-working lithographic printing plate precursor that comprises:
a substrate,
a negative-working imageable layer disposed over the substrate, the negative-working imageable layer comprising a free radically polymerizable component, an initiator composition that is capable of generating free radicals upon exposure to imaging radiation, a radiation absorbing compound, and a polymeric binder, and
an outermost water-soluble overcoat layer that is disposed directly on the negative-working imageable layer, the outermost water-soluble overcoat layer having a dry thickness (t), in μm, that is defined by the following equation (I):

$$t = w/r$$

wherein w is the dry coverage of the outermost water-soluble overcoat layer in g/m$^2$, and r is 1 g/cm$^3$,
the outermost water-soluble overcoat layer comprising:
(1) one or more film-forming water-soluble polymeric binders,
(2) organic wax particles having an average largest dimension D(wax) that is less than 0.9 of t (in μm), and (3) non-wax matte particles having an average largest dimension D(matte) that defined by the following equation (II):

$$1.5 \text{ times } t \leq D(\text{matte}) \leq 40 \text{ times } t \text{ (in μm)}.$$

2. The precursor of embodiment 1, wherein the dry thickness (t) of the outermost water-soluble overcoat layer is at least 0.05 μm and up to and including 4 μm.

3. The precursor of embodiment 1 or 2, wherein the organic wax particles are present in the outermost water-soluble overcoat layer in an amount of at least 0.05 weight % and up to and including 20 weight %, based on the total dry outermost water-soluble overcoat layer weight.

4. The precursor of any of embodiments 1 to 3, wherein the organic wax particles have an average largest dimension D(wax) that is defined by the following equation (III):

$$0.06 \text{ times } t \leq D(\text{wax}) < 0.75 \text{ times } t \text{ (in μm)}.$$

5. The precursor of any of embodiments 1 to 4, wherein the non-wax matte particles are present in the outermost water-soluble overcoat layer in an amount of at least 0.2 weight % and up to and including 20 weight %, based on the total dry outermost water-soluble overcoat layer weight.

6. The precursor of any of embodiments 1 to 5, wherein the non-wax matte particles are crosslinked organic particles.

7. The precursor of any of embodiments 1 to 6, wherein the organic wax particles are fluorinated or non-fluorinated hydrocarbon wax particles.

8. The precursor of any of embodiments 1 to 7, wherein the outermost water-soluble overcoat layer is present at a dry thickness of at least 0.1 μm and up to and including 2 μm.

9. The precursor of any of embodiments 1 to 8, wherein the organic wax particles have an average largest dimension of at least 0.08 μm and up to and including 0.8 μm.

10. The precursor of any of embodiments 1 to 9, wherein the one or more film-forming water-soluble polymeric binders comprise a modified or unmodified poly(vinyl alcohol) having a saponification degree of at least 30% and up to and including 99.9%.

11. The precursor of embodiment 10, wherein the one or more film-forming water-soluble polymeric binders comprise at least one modified poly(vinyl alcohol) that is modified with at least 0.1 mol % of one or more of the same or different groups selected from the group consisting of carboxylic acid, sulfonic acid, acetoacetyl, alkylene, silanol, amino, thioalkyl, glycol, sulfuric acid ester, phosphonic acid, and phosphoric acid ester groups.

12. The precursor of any of embodiments 1 to 11, wherein the negative-working imageable layer is sensitive to radiation at a $\lambda_{max}$ of either at least 250 nm and up to and including 450 nm, or at least 700 nm and up to and including 1400 nm.

13. The precursor of any of embodiments 1 to 12, wherein the initiator composition that is capable of generating free radicals upon exposure to imaging radiation comprises a diaryliodonium cation and a boron-containing anion, wherein the diaryliodonium cation is represented by the following Structure (I):

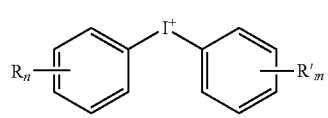

(I)

wherein R and R' independently represent halogen, nitro, alkyl, aryl, cycloalkyl, alkoxy, aryloxy, alkenyl, alkynyl, alkylamino, dialkylimino, alkylamido, arylamido, carbonyl, carboxy, sulfonyl, thioalkyl, or thioaryl groups, or two or more of the R and R' groups can be combined to form a fused carbocyclic or heterocyclic ring with respective phenyl groups, and n and m are independently 0 or integers from 1 to 5, and the boron-containing anion is represented by the following Structure (II):

wherein $R^1$, $R^2$, $R^3$, and $R^4$ independently represent alkyl, aryl, alkenyl, alkynyl, cycloalkyl, or heterocyclic groups, or two or more of $R^1$, $R^2$, $R^3$, and $R^4$ can be joined together to form a heterocyclic ring with the boron atom, such rings having up to 7 carbon, nitrogen, oxygen, or nitrogen atoms.

14. The precursor of embodiment 13, wherein the boron-containing anion comprises $R^1$, $R^2$, $R^3$, and $R^4$ that represent the same substituted or unsubstituted phenyl groups and the sum of m and n is 1 to 6.

15. A stack of a plurality of negative-working lithographic printing plate precursors, at least two adjacent precursors being precursor of any of embodiments 1 to 14, wherein the at least the two adjacent precursors are stacked without interleaf paper between them.

16. A method for preparing a lithographic printing plate, comprising:
imagewise exposing the negative-working lithographic printing plate precursor of any of embodiments 1 to 14 to form an imaged precursor with exposed regions and non-exposed regions in the negative-working imageable layer, and
processing the imaged precursor, to remove the non-exposed regions in the negative-working imageable layer to prepare a lithographic printing plate.

17. The method of embodiment 16, wherein the negative-working lithographic printing plate precursor is sensitive to infrared radiation and the imagewise exposing is carried out at a $\lambda_{max}$ of at least 700 nm and up to and including 1400 nm.

18. The method of embodiment 16, wherein the imagewise exposing is carried out at a $\lambda_{max}$ of at least 250 nm and up to and including 450 nm.

19. The method of any of embodiments 16 to 18 further comprising:
mounting the lithographic printing plate onto a printing press after the processing without any post-processing step.

20. The method of any of embodiments 16 to 19, comprising:
processing the imaged precursor off-press using a processing solution having a pH of at least 3 and up to and including 13, and comprising at least one compound selected from the group consisting of a nonionic surfactant, an anionic surfactant, a hydrophilic film-forming polymer, and a neutrally-charged hydrophilic compound other than a nonionic or anionic surfactant.

21. The method of any of embodiments 16 to 20, comprising:
processing the imaged precursor using a processing solution that both removes the non-exposed regions of the negative-working imageable layer and provides a protective coating over the processed precursor printing surface, and
further comprising mounting the lithographic printing plate onto a printing press after the processing without any post-processing step.

22. The method of any of embodiments 16 to 21, further comprising:
rinsing or gumming the lithographic printing plate,
drying the lithographic printing plate, and
optionally pre-heating the imaged precursor before the processing step.

23. The method of any of embodiments 16 to 18, comprising:
processing the imaged precursor to remove the non-exposed regions in the negative-working imageable layer on-press using a fountain solution, lithographic printing ink, or both.

The following Examples are provided to illustrate the practice of this invention and are not meant to be limiting in any manner. The components and materials used in the examples were as follows:

| | |
|---|---|
| Acticide ® LA1206 | Biocide mixture of 5-chloro-2-methyl-2H-isothiazol-3-one, 2-methyl-2H-isothiazol-3-one, and 2-bromo-2-nitropropane-1,3-diol (available from Thor) |
| Aerodisp ® 1030 | 30% Dispersion of surface modified silica particles in methoxypropylacetate (EVONIK, Germany) |
| Aquacer ® 507 | Anionic high density polyethylene wax dispersion, average particle size 100 nm (available from Byk, Germany) |
| Aquacer ® 513 | Nonionic high density polyethylene wax dispersion, average particle size 100 nm (available from Byk, Germany) |
| Binder 1 | Copolymer from 20 mol % methacrylic acid, 60 mol % allyl methacrylate, and 20 mol % benzyl methacrylate |
| Binder 2 | Hyperbranched polyurethane (preparation shown below) |
| Byk ® 307 | Polyethoxylated dimethyl polysiloxane (from Byk) |
| CN2302 | Hyperbranched polyester acrylate (available from Sartomer) |
| Co-initiator 1 | 2-Mercaptobenzthiazole |
| Gohsefimer WR-12 | PVA having acetoacetyl-groups (saponification degree of 93%) (available from Kuraray Co., Japan) |
| Gohseran L-3266 | PVA from Nippon Gohsei having sulfonic acid groups (saponification value 87.2%) |
| Gohseran CKS-50 | PVA from Nippon Gohsei having sulfonic acid groups (saponification value 99%) |
| G-Polymer AZF8035W | PVA from Nippon Gohsei having 3,4-dihydroxy butane unit (saponification degree 98.8%) |
| G-Polymer OKS-6026 | PVA from Nippon Gohsei having 3,4-dihydroxy butane unit (saponification degree 99.1%) |
| G-Polymer OKS-1011 | PVA from Nippon Gohsei having 3,4-dihydroxy butane unit (saponification degree 99.1%) |

-continued

| | |
|---|---|
| G-Polymer OKS 8035 | PVA from Nippon Gohsei having 3,4-dihydroxy butane unit (saponification degree 98.8%) |
| G-Polymer OKS-8049 | PVA from Nippon Gohsei having 3,4-dihydroxy butane unit (saponification degree 99.2%) |
| G-Polymer OKS-1028 | PVA from Nippon Gohsei having 3,4-dihydroxy butane unit (saponification degree 99.0%) |
| G-Polymer OKS-8041 | PVA from Nippon Gohsei having 3,4-dihydroxy butane unit (saponification degree 89.0%) |
| G-Polymer OKS-8089 | PVA from Nippon Gohsei having 3,4-dihydroxy butane unit (saponification degree 85.9%) |
| Inhibitor 1 | N-nitrosophenylhydroxylamine aluminum salt |
| Initiator 1 | Bis(4-isopropylphenyl)iodonium tetraphenylborate |
| Initiator 2 | 2,2-bis-(2-chlorophenyl)-4,5,4',5'-tetraphenyl-2'H-[1,2]biimidazolyl |

IR Dye 1

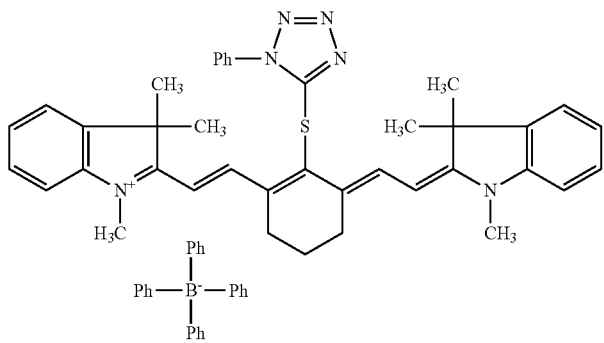 [SMILES: CN1/C(=C/C=C2\CCCC(/C=C/C3=[N+](C)c4ccccc4C3(C)C)=C2Sc2nnnn2-c2ccccc2)C(C)(C)c2ccccc21 ; c1ccc([B-](c2ccccc2)(c2ccccc2)c2ccccc2)cc1]

| | |
|---|---|
| KL-506 | PVA with COOH-functionalities (saponification degree of 78%, available from Kuraray) |
| LUBA-print 499 | Polyethylene wax particle dispersion having an average particle size of 150 nm (available from Muenzing Liquid Technologies GmbH) |
| Lutensol ® TO10 | Ethoxylated (10 EO units) C13-alcohol (available from BASF Corporation) |
| MEK | Methyl ethyl ketone |
| Monomer 1 | Urethane methacrylate made from glycerol dimethacrylate, glycerol monomethacrylate, propylene glycol methacrylate, and biuret of hexamethylene diisocyanate corresponding to oligomer m1 in EP 1,969,426B1 |
| Monomer 2 | Sipomer PAM-100 phosphate functionalized methacrylate with polyalkylene oxide spacer (from Rhodia, France) |
| Newcol 2305, 2320 | Nonionic surfactants from Nippon Nyukazai Co., Ltd; mixture of $C_{12}$ and $C_{13}$ compounds |
| PGME | Propylene glycol monomethyl ether |
| Pigment 1 | Dispersion in propylene glycol monomethyl ether containing 9 weight % of copper phthalocyanine and 1 weight % of a poly(vinyl acetal) binder containing 39.9 mol % of vinyl alcohol, 1.2 mol % of vinyl acetate, 15.4 mol % of acetal groups from acetaldehyde, 36.1 mol % of acetal groups from butyraldehyde, and 7.4 acetal groups from 4-formylbenzoic acid |
| Pigment 2 | Dispersion in propylene glycol monomethyl ether containing 9 weight % of heliogene blue 7565 and 4 weight % of a poly(vinyl acetal) binder containing 39.9 mol % of vinyl alcohol, 1.2 mol % of vinyl acetate, 15.4 mol % of acetal groups from acetaldehyde, 36.1 mol % of acetal groups from butyraldehyde, and 7.4 acetal groups from 4-formylbenzoic acid |
| PVA-203 | Polyvinyl alcohol (saponification value 88%, n = 300) (available from Kuraray) |
| PVP | PVP K-15, poly(vinyl pyrrolidone) from ISP, USA |
| SD-1000 | PVA having COOH-functionalities (saponification value 85%) (available from Kuraray) |
| SDy-70 | Silicate coated crosslinked polystyrene beads (available from Eastman Kodak Company) |

Sensitizer 1

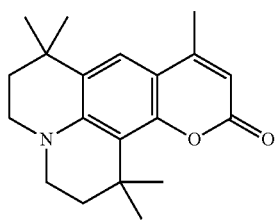 [SMILES: Cc1cc(=O)oc2c3c4c(cc12)C(C)(C)CCN4CCC3(C)C]

-continued

| | |
|---|---|
| SSX-101 | Crosslinked poly(methyl methacrylate) particles with monodispersity of particle size of 1 μm (available from Sekisui) |
| SSX-102 | Crosslinked poly(methyl methacrylate) particles with monodispersity of particle size of 2 μm (available from Sekisui) |
| SSX-103 | Crosslinked poly(methyl methacrylate) particles with monodispersity of particle size of 3 μm (available from Sekisui) |
| SSX-105 | Crosslinked poly(methyl methacrylate) particles with monodispersity of particle size of 5 μm (available from Sekisui) |
| SSX-108 | Crosslinked poly(methyl methacrylate) particles with monodispersity of particle size of 8 μm (available from Sekisui) |
| SSX-110 | Crosslinked poly(methyl methacrylate) particles with monodispersity of particle size of 10 μm (available from Sekisui) |
| SSX-115 | Crosslinked poly(methyl methacrylate) particles with monodispersity of particle size of 15 μm (available from Sekisui) |
| Surfynol ® 440 | Ethoxylated 2,4,7,9-tetramethyl-5-decyn-4,7-diol (available from AIR PRODUCTS) |
| TEGO ® Glide 482 | Dispersion of high molecular polydimethyl siloxane in water, particle size smaller than 500 nm (available from TEGO Germany) |
| VPC55K65W | Copolymer derived from N-vinyl pyrrolidone and vinyl caprolactame (manufactured by BASF Corporation) |

Binder 2 was prepared as follows:

A three-necked round bottom flask equipped with magnetic stirrer, thermometer, condenser, drying tube and dropping funnel was loaded with 206.84 g of a 27 weight % solution of tris-isocyanatophenylthiophosphate in ethyl acetate (120 mmol). To this solution were added 82.16 g (360 mmol) of glycerol 1,3-dimethacrylate were dissolved in 200 g of dry ethyl acetate. The resulting reaction mixture was stirred at room temperature overnight before about 20 ml of methanol were added and the reaction mixture was then stirred for one more hour to remove excess isocyanate. A portion of the ethyl acetate was removed by rotary evaporation to yield a 50 weight % solution with a yield of 100% of the desired Binder 2.

Preparation 1 for Lithographic Printing Plate Precursors

A coating composition as shown below in TABLE I was coated, followed by drying at 110° C. for 40 seconds, on an electrochemically grained and anodized aluminium substrate (Ra of 0.55 mm, $Al_2O_3$ layer weight: 2.7 $g/m^2$) that had been post-treated with condensed arylsulfonate compound solution in order to provide a dry coating weight of 1.4 $g/m^2$ as an inner imageable layer (BC-1). Each of the coating compositions (component %) shown in TABLES IIa and IIb was applied to each coated BC-1 to provide a dry coating weight of 0.6 $g/m^2$ outer imageable layer ("outer layer", OC-1 through OC-20) for the resulting lithographic printing plate precursors.

The dry coating weight was measured gravimetrically by subtracting the weight of 1 $dm^2$ of an unexposed dried lithographic printing plate precursor samples by a sample in which the coating was removed. To obtain the coating weights of the outermost water-soluble overcoat layer coating, each sample was washed with water having a temperature of 15° C. to 20° C. To obtain the coating weight of the negative-working imageable layer, the removal of the layer was carried out by washing it with water to remove the outermost water-soluble overcoat layer followed by washing with the coating solvent mixture. The resulting overall coating weight is the sum of the coating weight of both layers. The coating weight of the negative-working imageable layer was obtained by subtracting the coating weight of the outermost water-soluble overcoat layer coating weight from the overall coating weight. The dry coating weights were arithmetic means for three measurements of each Invention Example and Comparative Example precursor. Using an assumption that the dry density of each layer was 1 $g/cm^3$, the dry thickness a layer with 1 $g/m^2$ coating coverage can be calculated to 1 μm.

TABLE I

| | BC-1 Solid % | BC-1 Solution % |
|---|---|---|
| PGME | 0 | 65.64 |
| MEK | 0 | 16.41 |
| Binder 1 | 37.66 | 3.01 |
| CN2302 | 20.74 | 1.66 |
| Monomer 1 | 20.64 | 5.50 |
| IR Dye 1 | 1.55 | 0.12 |
| Initiator 1 | 2.58 | 0.21 |
| Pigment 1 | 6.20 | 4.96 |
| Aerodisp ® 1030 | 10.32 | 2.36 |
| Byk ® 307 | 0.31 | 0.12 |
| Total | 100.0 | 100.0 |

TABLE IIa

| | OC-1 | OC-2 | OC-3 | OC-4 | OC-5 | OC-6 | OC-7 | OC-8 | OC-9 | OC-10 |
|---|---|---|---|---|---|---|---|---|---|---|
| Deionized water | 96.73 | 96.73 | 96.73 | 96.73 | 96.73 | 96.73 | 96.73 | 96.73 | 96.73 | 96.73 |
| PVA-203 | 2.57 | 2.57 | 2.57 | 2.57 | 2.57 | 2.57 | 2.57 | 0 | 0 | 0 |
| AZF8035W | 0 | 0 | 0 | 0 | 0 | 0 | 0 | 2.57 | 0 | 0 |
| OKS-6026 | 0 | 0 | 0 | 0 | 0 | 0 | 0 | 0 | 2.57 | 0 |
| OKS-1011 | 0 | 0 | 0 | 0 | 0 | 0 | 0 | 0 | 0 | 2.57 |
| VPC55K65W | 0.17 | 0.17 | 0.17 | 0.17 | 0.17 | 0.17 | 0.17 | 0.17 | 0.17 | 0.17 |
| LUBA-print 499 | 0.23 | 0.23 | 0.23 | 0.23 | 0.23 | 0.23 | 0.23 | 0.23 | 0.23 | 0.23 |
| Newcol 2305 | 0.09 | 0.09 | 0.09 | 0.09 | 0.09 | 0.09 | 0.09 | 0.09 | 0.09 | 0.09 |
| Newcol 2320 | 0.18 | 0.18 | 0.18 | 0.18 | 0.18 | 0.18 | 0.18 | 0.18 | 0.18 | 0.18 |

TABLE IIa-continued

|         | OC-1 | OC-2 | OC-3 | OC-4 | OC-5 | OC-6 | OC-7 | OC-8 | OC-9 | OC-10 |
|---------|------|------|------|------|------|------|------|------|------|-------|
| SSX-101 | 0.05 | 0    | 0    | 0    | 0    | 0    | 0    | 0    | 0    | 0     |
| SSX-103 | 0    | 0.05 | 0    | 0    | 0    | 0    | 0    | 0    | 0    | 0     |
| SSX-105 | 0    | 0    | 0.05 | 0    | 0    | 0    | 0    | 0    | 0    | 0     |
| SSX-108 | 0    | 0    | 0    | 0.05 | 0    | 0    | 0    | 0.05 | 0.5  | 0.5   |
| SSX-110 | 0    | 0    | 0    | 0    | 0.05 | 0    | 0    | 0    | 0    | 0     |
| SSX-115 | 0    | 0    | 0    | 0    | 0    | 0.05 | 0    | 0    | 0    | 0     |
| SDy-70  | 0    | 0    | 0    | 0    | 0    | 0    | 0.05 | 0    | 0    | 0     |
| Total   | 100.0 | 100.0 | 100.0 | 100.0 | 100.0 | 100.0 | 100.0 | 100.0 | 100.0 | 100.0 |

TABLE IIb

|                | OC-11 | OC-12 | OC-13 | OC-14 | OC-15 | OC-16 | OC-17 | OC-18 | OC-19 | OC-20 |
|----------------|-------|-------|-------|-------|-------|-------|-------|-------|-------|-------|
| Deionized water | 96.73 | 96.73 | 96.73 | 96.73 | 96.77 | 96.81 | 96.84 | 96.86 | 96.72 | 96.86 |
| PVA-203        | 0     | 0     | 0     | 0     | 2.59  | 2.62  | 2.63  | 2.65  | 2.61  | 2.69  |
| OKS-8049       | 2.57  | 0     | 0     | 0     | 0     | 0     | 0     | 0     | 0     | 0     |
| OKS-1028       | 0     | 2.57  | 0     | 0     | 0     | 0     | 0     | 0     | 0     | 0     |
| OKS-8041       | 0     | 0     | 2.57  | 0     | 0     | 0     | 0     | 0     | 0     | 0     |
| OKS-8089       |       |       |       | 2.57  |       |       |       |       |       |       |
| VPC55K65W      | 0.17  | 0.17  | 0.17  | 0.17  | 0.18  | 0.18  | 0.18  | 0.18  | 0.18  | 0.18  |
| LUBA-print 499 | 0.23  | 0.23  | 0.23  | 0.23  | 0.15  | 0.08  | 0.04  | 0     | 0.23  | 0     |
| Newcol 2305    | 0.09  | 0.09  | 0.09  | 0.09  | 0.09  | 0.09  | 0.09  | 0.09  | 0.09  | 0.09  |
| Newcol 2320    | 0.18  | 0.18  | 0.18  | 0.18  | 0.18  | 0.18  | 0.18  | 0.18  | 0.18  | 0.18  |
| SSX-108        | 0.05  | 0.05  | 0.05  | 0.05  | 0.05  | 0.05  | 0.05  | 0.05  | 0     | 0     |
| Total          | 100.0 | 100.0 | 100.0 | 100.0 | 100.0 | 100.0 | 100.0 | 100.0 | 100.0 | 100.0 |

Preparation 2 for Lithographic Printing Plate Precursors

A coating solution as shown below in TABLE III or TABLE IV was coated, followed by drying at 88° C. for 4 minutes, on an electrochemically grained and anodized aluminium substrate (Ra: 0.55 mm, $Al_2O_3$ layer weight: 2.7 $g/m^2$) that had been post-treated with poly(vinyl phosphonic acid) solution in order to provide a dry coating weight of 1.4 $g/m^2$ (BC-2) or 1.6 $g/m^2$ (BC-3) as an inner imageable layer.

TABLE III

|              | BC-2 Solid % | BC-2 Solution % |
|--------------|--------------|-----------------|
| PGME         | 0            | 15.78           |
| Butanone     | 0            | 70.0            |
| Binder 1     | 36.45        | 2.30            |
| Pigment 1    | 6.01         | 3.790           |
| CN2302       | 20.12        | 1.270           |
| Monomer 1    | 20.12        | 4.230           |
| Monomer 2    | 3.00         | 0.189           |
| Sensitizer 1 | 1.50         | 0.095           |
| Initiator 1  | 2.50         | 0.158           |
| Aerodisp ® 1030 | 10.0      | 2.10            |
| Total        | 100.0        | 100.0           |

TABLE IV

|                  | BC-3 Solid % | BC-3 Solution % |
|------------------|--------------|-----------------|
| PGME             | 0            | 68.55           |
| Acetone          | 0            | 7.35            |
| Binder 2         | 36.88        | 7.38            |
| Pigment 2        | 5.43         | 3.42            |
| Kayamer PM-2     | 0.24         | 0.02            |
| Monomer 1        | 41.31        | 11.60           |
| HB-NK Ester PBE 200 | 9.03      | 0.72            |

TABLE IV-continued

|               | BC-3 Solid % | BC-3 Solution % |
|---------------|--------------|-----------------|
| Sensitizer 1  | 3.00         | 0.24            |
| Initiator 2   | 3.18         | 0.25            |
| Co-initiator 1 | 0.48        | 0.04            |
| Inhibitor 1   | 0.48         | 0.04            |
| Total         | 100.0        | 100.0           |

Each of the compositions (component %) described in TABLE V below was applied to inner imageable layer BC-2 and each of the compositions (component %) shown below in TABLE VI was applied to inner imageable layer BC-3, to provide a dry coating weight of 1.2 $g/m^2$ to provide a outer imageable layer ("outer layer", OC-21 through OC-37) for each resulting lithographic printing plate precursor. The coating weights and coating layer thickness were measured as described above.

Measurements of Particle Sizes

To measure the particle size, the outermost water-soluble overcoat layer formulation (and layer) was prepared with either only the non-wax matte particles or the organic wax particles and all other components shown in TABLES II and V. Cross-sections of each samples were measured by SEM and the magnification was adapted to each particle size to get best resolution and the internal SEM scale was used to get the absolute values. Three SEM measurements were randomly selected from a representative area of the cross-section for each sample. For the organic wax particles, all particles above 0.02 μm size were measured. The arithmetic mean for the various organic wax particles was:

| | |
|---|---|
| Aquacer ® 507 | 95 nm |
| Aquacer ® 513 | 104 nm |
| LUBA-Print 499 | 140 nm |
| TEGO ® Glide 482 | 240 nm |

The size of the non-wax matte particles was measured using the same method. All particles having a size above 0.1 μm were used for the calculations of the arithmetic mean. It was found that the measured particle sizes are very similar to the specification of the suppliers listed in TABLES VII and VIII.

TABLE V

| | OC-21 | OC-22 | OC-23 | OC-24 | OC-25 | OC-26 | OC-27 | OC-28 | OC-29 | OC-30 | OC-31 | OC-32 | OC-33 | OC-34 | OC-35 |
|---|---|---|---|---|---|---|---|---|---|---|---|---|---|---|---|
| Deionized water | 91.71 | 91.71 | 91.71 | 91.71 | 91.71 | 91.97 | 91.97 | 91.83 | 91.71 | 91.71 | 91.71 | 91.71 | 91.98 | 91.89 | 92.15 |
| G-Polymer OKS-8041 | 7.08 | 7.08 | 7.08 | 7.08 | 7.08 | 7.10 | 7.10 | 7.09 | 0 | 0 | 0 | 0 | 7.48 | 7.10 | 7.12 |
| SD-1000 | 0 | 0 | 0 | 0 | 0 | 0 | 0 | 0 | 7.08 | 0 | 0 | 0 | 0 | 0 | 0 |
| Gohseran L-3266 | 0 | 0 | 0 | 0 | 0 | 0 | 0 | 0 | 0 | 7.08 | 0 | 0 | 0 | 0 | 0 |
| Gohsefimer WR-12 | 0 | 0 | 0 | 0 | 0 | 0 | 0 | 0 | 0 | 0 | 7.08 | 0 | 0 | 0 | 0 |
| KL-506 | 0 | 0 | 0 | 0 | 0 | 0 | 0 | 0 | 0 | 0 | 0 | 7.08 | 0 | 0 | 0 |
| SSX-105 | 0.19 | 0 | 0 | 0 | 0 | 0.19 | 0.19 | 0.19 | 0.19 | 0.19 | 0.19 | 0.19 | 0 | 0 | 0.19 |
| SSX-110 | 0 | 0.19 | 0 | 0 | 0 | 0 | 0 | 0 | 0 | 0 | 0 | 0 | 0 | 0 | 0 |
| SSX-102 | 0 | 0 | 0.19 | 0 | 0 | 0 | 0 | 0 | 0 | 0 | 0 | 0 | 0 | 0 | 0 |
| SDy-70 | 0 | 0 | 0 | 0.19 | 0.19 | 0 | 0 | 0 | 0 | 0 | 0 | 0 | 0 | 0 | 0 |
| LUBA-print 499 | 0.48 | 0.48 | 0.48 | 0.48 | 0.48 | 0 | 0 | 0 | 0.48 | 0.48 | 0.48 | 0.48 | 0 | 0.48 | 0 |
| Aquacer ® 507 | 0 | 0 | 0 | 0 | 0 | 0.19 | 0 | 0 | 0 | 0 | 0 | 0 | 0 | 0 | 0 |
| Aquacer ® 513 | 0 | 0 | 0 | 0 | 0 | 0 | 0.19 | 0 | 0 | 0 | 0 | 0 | 0 | 0 | 0 |
| TEGO Glide 482 | 0 | 0 | 0 | 0 | 0 | 0 | 0 | 0.35 | 0 | 0 | 0 | 0 | 0 | 0.00 | 0.00 |
| Lutensol ® TO10 | 0.51 | 0.51 | 0.51 | 0.51 | 0.51 | 0.51 | 0.51 | 0.51 | 0.51 | 0.51 | 0.51 | 0.51 | 0.51 | 0.51 | 0.51 |
| Surfynol ® 440 | 0.02 | 0.02 | 0.02 | 0.02 | 0.02 | 0.02 | 0.02 | 0.02 | 0.02 | 0.02 | 0.02 | 0.02 | 0.02 | 0.02 | 0.02 |
| Acticide ® LA1206 | 0.01 | 0.01 | 0.01 | 0.01 | 0.01 | 0.01 | 0.01 | 0.01 | 0.01 | 0.01 | 0.01 | 0.01 | 0.01 | 0.01 | 0.01 |

TABLE VI

| | OC-36 | OC-37 |
|---|---|---|
| Deionized water | 85.0 | 85.0 |
| G-Polmer AZF-8035W | 8.40 | 8.28 |
| PVP | 1.49 | 1.49 |
| SSX-105 | 0 | 0.10 |
| LUBA-Print 499 | 0 | 0.05 |
| Lutensol ® TO10 | 0.05 | 0.05 |
| Surfynol ® 440 | 0.02 | 0.02 |
| Acticide ® LA1206 | 0.01 | 0.01 |

Evaluations of Lithographic Printing Plate Precursors with OC-1 through OC-20:

Scratch Resistance Evaluation:

Scratch resistance in the precursors was evaluated by using a Scratching Intensity Tester (HEIDON-18) equipped with a spherical ball as a scratch stylus tip. Each precursor was scratched with a progressive road. After each scratching, each precursor was imaged at 90 mJ/cm$^2$ by using solid pattern on PT-R4300, and developed using Developer TN-D1 at 30° C. for 13 seconds in a PK-1310NEWS processor. Each resulting lithographic printing plate was inked by hand in order to make scratching damage of the imaging area more visible. The ink was then removed by wiping each printing plate with plate cleaner. The degree of printing plate surface damage was rated from 1 (the most scratch resistance) to 3 (poor scratch resistance).

Blocking Property Evaluation:

Each lithographic printing plate precursor was cut into 20×20 cm samples that were stacked onto each other without interleaf paper between adjacent samples. A 4 kg weight (base area of 20×20 cm) was put over the stacked precursor samples. The precursor samples that had been held down by the weight were treated at 40° C./80% RH for 6 days. The blocking level of these treated precursor samples was then rated from 1 (no blocking) to 3 (significant blocking).

The results of these evaluations are listed in the following TABLES VII and VIII.

TABLE VII

| Precursor Outer Layer | Outer Layer Polymer | LUBA-Print 499 Solid % in Outer Layer | Matte Beads Diameter (μm) | Matte Beads Solid % in Outer Layer | Scratch Resistance Evaluation | Blocking Property Evaluation |
|---|---|---|---|---|---|---|
| OC-1 | PVA/VPC | 3.0 | 1 | 1.5 | 1 | 2 |
| OC-2 | PVA/VPC | 3.0 | 3 | 1.5 | 1 | 2 |
| OC-3 | PVA/VPC | 3.0 | 5 | 1.5 | 1 | 1 |
| OC-4 | PVA/VPC | 3.0 | 8 | 1.5 | 1 | 1 |
| OC-5 | PVA/VPC | 3.0 | 10 | 1.5 | 1 | 1 |
| OC-6 | PVA/VPC | 3.0 | 15 | 1.5 | 1 | 1 |
| OC-7 | PVA/VPC | 3.0 | 6 | 1.5 | 1 | 1 |
| OC-8 | AZF8035W/VPC | 3.0 | 8 | 1.5 | 1 | 1 |
| OC-9 | OKS-6026/VPC | 3.0 | 8 | 1.5 | 1 | 1 |
| OC-10 | OKS-1011/VPC | 3.0 | 8 | 1.5 | 1 | 1 |
| OC-11 | OKS-8049/VPC | 3.0 | 8 | 1.5 | 1 | 1 |
| OC-12 | OKS-1028/VPC | 3.0 | 8 | 1.5 | 1 | 1 |

TABLE VII-continued

| Precursor Outer Layer | Outer Layer Polymer | LUBA-Print 499 Solid % in Outer Layer | Matte Beads Diameter (μm) | Matte Beads Solid % in Outer Layer | Scratch Resistance Evaluation | Blocking Property Evaluation |
|---|---|---|---|---|---|---|
| OC-13 | OKS-8041/VPC | 3.0 | 8 | 1.5 | 1 | 1 |
| OC-14 | OKS-8089/VPC | 3.0 | 8 | 1.5 | 1 | 1 |
| OC-15 | PVA/VPC | 2.0 | 8 | 1.5 | 1 | 1 |
| OC-16 | PVA/VPC | 1.0 | 8 | 1.5 | 2 | 1 |
| OC-17 | PVA/VPC | 0.5 | 8 | 1.5 | 2 | 1 |

TABLE VIII

| Precursor Outer Layer | Outer Layer Polymer | LUBA-Print 499 Solid % in Outer Layer | Matte Beads Diameter (μm) | Matte Beads Solid % in Outer Layer | Scratch Resistance Evaluation | Blocking Property Evaluation |
|---|---|---|---|---|---|---|
| OC-18 | PVA/VPC | 0 | 8 | 1.5 | 3 | 2 |
| OC-19 | " | 3.0 | None | 0 | 1 | 3 |
| OC-20 | " | 0 | None | 0 | 3 | 3 |

Evaluations of Lithographic Printing Plate Precursors with OC-21 through OC-36:

Scratch Resistance Evaluation:

Scratch resistance was evaluated by using a Scratching Intensity Tester (HEIDON-18) equipped with a spherical ball as a scratch stylus tip. Each lithographic printing plate precursor was scratched with a progressive road. After the scratching, each precursor was imaged at 70 mJ/cm$^2$ (for the 830 nm imaging tests) or 50 μJ/cm$^2$ (for the 405 nm imaging tests) by using a solid pattern on a Trendsetter 3244 (Eastman Kodak Company) or Pro Setter platesetter (Heidelberger Druckmaschinen), and then developed using Kodak® SP500 developer at 24° C. for 20 seconds in a Raptor 85 processor (Glunz & Jensen).

Each resulting lithographic printing plate was inked by hand in order to make scratching damage of imaging area more visible. The ink was then removed by wiping with plate cleaner. The degree of printing plate surface damage was rated from 1 (the most scratch resistance) to 3 (poor resistance).

Blocking Property Evaluation:

Each lithographic printing plate precursor was cut into 20×20 cm samples, and the pieces were stacked without interleaf paper between adjacent samples. A 4 kg weight (with an area of base being 20×20 cm) was put over the stacked precursor samples. The precursor samples that had been held down by the weight were treated at 40° C./80% RH for 6 days. The blocking level of these precursor samples was rated from 1 (best-no blocking) to 3 (poorest-significant blocking).

The results of these evaluations are shown in the following TABLES IX-XII.

TABLE IX

| Precursor Outer Layer | Outer Layer Polymer | Wax Particle Solid % in Outer Layer | Matte Beads Solid % in Outer Layer | Scratch Resistance | Blocking property |
|---|---|---|---|---|---|
| OC-21 | G-Polymer OKS-8041 | LUBA-Print 499 2.4% | SSX-105 2.4% | 1 | 1 |
| OC-22 | G-Polymer OKS-8041 | LUBA-Print 499 2.4% | SSX-110 2.4% | 2 | 1 |
| OC-23 | G-Polymer OKS-8041 | LUBA-Print 499 2.4% | SSX-102 2.4% | 1 | 2 |
| OC-24 | G-Polymer OKS-8041 | LUBA-Print 499 2.4% | SDy-70 2.4% | 1 | 1 |
| OC-25 | G-Polymer OKS-8041 | LUBA-Print 499 2.4% | Sx-105 2.4% | 1 | 1 |
| OC-26 | G-Polymer OKS-8041 | Aquacer® 507 0.84% | SSX-105 2.4% | 1 | 1 |
| OC-27 | G-Polymer OKS-8041 | Aquacer® 513 0.84% | SSX-105 2.4% | 2 | 1 |
| OC-28 | G-Polymer OKS-8041 | TEGO® Glide 482 2.8% | SSX-105 2.4% | 1 | 1 |
| OC-29 | SD-1000 | LUBA-Print 499 2.4% | SSX-105 2.4% | 1 | 1 |
| OC-30 | Gohseran L-3266 | LUBA-Print 499 2.4% | SSX-105 2.4% | 1 | 1 |
| OC-31 | Gohsefimer WR-12 | LUBA-Print 499 2.4% | SSX-105 2.4% | 1 | 1 |
| OC-32 | KL-506 | LUBA-Print 499 2.4% | SSX-105 2.4% | 1 | 1 |

TABLE X

| Precursor Outer Layer | Outer Layer Polymer | Wax Particle Solid % in Outer Layer | Matte Beads Solid % in Outer Layer | Scratch Resistance | Blocking property |
|---|---|---|---|---|---|
| OC-33 | G-Polymer OKS-8041 | None | None | 2 | 3 |
| OC-34 | G-Polymer OKS-8041 | LUBA-Print 499 2.45% | None | 1 | 3 |

TABLE X-continued

| Precursor Outer Layer | Outer Layer Polymer | Wax Particle Solid % in Outer Layer | Matte Beads Solid % in Outer Layer | Scratch Resistance | Blocking property |
|---|---|---|---|---|---|
| OC-35 | G-Polymer OKS-8041 | None | SSX-105 2.4% | 3 | 1 |

TABLE XI

| Precursor Outer Layer | Outer Layer Polymer | Wax Particle Solid % in Outer Layer | Matte Beads Solid % in Outer Layer | Scratch Resistance | Blocking property |
|---|---|---|---|---|---|
| OC-37 | G-Polymer AZF 8035W/PVP | LUBA-Print 499 0.50% | SSX-105 1.0% | 1 | 1 |

TABLE XII

| Outer Layer | Outer Layer Polymer | Wax Particle Solid % in Outer Layer | Matte Beads Solid % in Outer Layer | Scratch Resistance | Blocking property |
|---|---|---|---|---|---|
| OC-36 | G-Polymer AZF 8035W/PVP | None | None | 3 | 3 |

The results in the evaluations provided above show that the use of a combination of organic wax particles and non-wax matte particles in the outermost water-soluble overcoat layer resulted in lithographic printing plate precursors having excellent scratch resistance and lower propensity to blocking. Furthermore, it was found that the use of this combination of organic wax particles and non-wax matte particles has minimal negative impact on photo speed, shelf life, and press performance of the resulting lithographic printing plates.

Lithographic printing plate precursors having an outermost water-soluble overcoat layer comprising only the non-wax matte particles exhibited a low tendency to blocking but also exhibited higher scratch sensitivity (higher propensity to scratching) compared to precursors having neither organic wax particles nor non-wax matte particles in the noted layer.

The lithographic printing plate precursors having only the organic wax particles in the outermost water-soluble overcoat layer exhibited very good scratch resistance but the presence of the organic wax particles did not reduce blocking that is a problem of greater concern for adjacent precursors provided in stacks without interleaf paper between them.

The invention has been described in detail with particular reference to certain preferred embodiments thereof, but it will be understood that variations and modifications can be effected within the spirit and scope of the invention.

The invention claimed is:

1. A negative-working lithographic printing plate precursor that comprises:
a substrate,
a negative-working imageable layer disposed over the substrate, the negative-working imageable layer comprising a free radically polymerizable component, an initiator composition that is capable of generating free radicals upon exposure to imaging radiation, a radiation absorbing compound, and a polymeric binder, and
an outermost water-soluble overcoat layer that is disposed directly on the negative-working imageable layer, the outermost water-soluble overcoat layer having a dry thickness (t), in µm, that is defined by the following equation (I):

$$t = w/r$$

wherein w is the dry coverage of the outermost water-soluble overcoat layer in g/m$^2$, and r is 1 g/cm$^3$,
the outermost water-soluble overcoat layer comprising:
(1) one or more film-forming water-soluble polymeric binders,
(2) organic wax particles having an average largest dimension D(wax) that is at least 0.08 µm and up to and including 0.8 µm, and meets the following Equation (III):

$$0.06 \text{ times } t < D(\text{wax}) < 0.75 \text{ times } t \text{ (in µm)};$$

and
(3) non-wax matte particles having an average largest dimension D(matte) that is defined by the following equation (II):

$$1.5 \text{ times } t \leq D(\text{matte}) \leq 40 \text{ times } t \text{ (in µm)}.$$

2. The precursor of claim 1, wherein the dry thickness (t) of the outermost water-soluble overcoat layer is at least 0.05 µm and up to and including 4 µm.

3. The precursor of claim 1, wherein the organic wax particles are present in the outermost water-soluble overcoat layer in an amount of at least 0.05 weight % and up to and including 20 weight %, based on the total dry outermost water-soluble overcoat layer weight.

4. The precursor of claim 1, wherein the non-wax matte particles are present in the outermost water-soluble overcoat layer in an amount of at least 0.2 weight % and up to and including 20 weight %, based on the total dry outermost water-soluble overcoat layer weight.

5. The precursor of claim 1, wherein the non-wax matte particles are crosslinked organic particles.

6. The precursor of claim 1, wherein the organic wax particles are fluorinated or non-fluorinated hydrocarbon wax particles.

7. The precursor of claim 1, wherein the outermost water-soluble overcoat layer is present at a dry thickness of at least 0.1 µm and up to and including 2 µm.

8. The precursor of claim 1, wherein the one or more film-forming water-soluble polymeric binders comprise a modified or unmodified poly(vinyl alcohol) having a saponification degree of at least 30% and up to and including 99.9%.

9. The precursor of claim 8, wherein the one or more film-forming water-soluble polymeric binders comprise at least one modified poly(vinyl alcohol) that is modified with at least 0.1 mol % of one or more of the same or different groups selected from the group consisting of carboxylic acid, sulfonic acid, acetoacetyl, alkylene, silanol, amino, thioalkyl, glycol, sulfuric acid ester, phosphonic acid, and phosphoric acid ester groups.

10. The precursor of claim 1, wherein the negative-working imageable layer is sensitive to radiation of at least 700 nm and up to and including 1400 nm.

11. The precursor of claim 1, wherein the initiator composition that is capable of generating free radicals upon exposure to imaging radiation comprises a diaryliodonium cation and a boron-containing anion, wherein the diaryliodonium cation is represented by the following Structure (I):

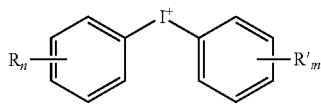

(I)

wherein R and R' independently represent halogen, nitro, alkyl, aryl, cycloalkyl, alkoxy, aryloxy, alkenyl, alkynyl, alkylamino, dialkylimino, alkylamido, arylamido, carbonyl, carboxy, sulfonyl, thioalkyl, or thioaryl groups, or two or more of the R and R' groups can be combined to form a fused carbocyclic or heterocyclic ring with respective phenyl groups, and n and m are independently 0 or integers from 1 to 5, and the boron-containing anion is represented by the following Structure (II):

(II)

wherein $R^1$, $R^2$, $R^3$, and $R^4$ independently represent alkyl, aryl, alkenyl, alkynyl, cycloalkyl, or heterocyclic groups, or two or more of $R^1$, $R^2$, $R^3$, and $R^4$ can be joined together to form a heterocyclic ring with the boron atom, such rings having up to 7 carbon, nitrogen, oxygen, or nitrogen atoms.

12. The precursor of claim 11, wherein the boron-containing anion comprises $R^1$, $R^2$, $R^3$, and $R^4$ that represent the same substituted or unsubstituted phenyl groups and the sum of m and n is 1 to 6.

13. A stack of a plurality of negative-working lithographic printing plate precursors, at least two adjacent precursors being precursor of claim 1, wherein the at least the two adjacent precursors are stacked without interleaf paper between them.

14. A method for preparing a lithographic printing plate, comprising:
 imagewise exposing the negative-working lithographic printing plate precursor of claim 1 to form an imaged precursor with exposed regions and non-exposed regions in the negative-working imageable layer, and
 processing the imaged precursor, to remove the non-exposed regions in the negative-working imageable layer to prepare a lithographic printing plate.

15. The method of claim 14, wherein the negative-working lithographic printing plate precursor is sensitive to infrared radiation and the imagewise exposing is carried out at a $\lambda_{max}$ of at least 700 nm and up to and including 1400 nm.

16. The method of claim 14, wherein the imagewise exposing is carried out at a $\lambda_{max}$ of at least 250 nm and up to and including 450 nm.

17. The method of claim 14 further comprising:
 mounting the lithographic printing plate onto a printing press after the processing without any post-processing step.

18. The method of claim 14, comprising:
 processing the imaged precursor off-press using a processing solution having a pH of at least 3 and up to and including 13, and comprising at least one compound selected from the group consisting of a nonionic surfactant, an anionic surfactant, a hydrophilic film-forming polymer, and a neutrally-charged hydrophilic compound other than a nonionic or anionic surfactant.

19. The method of claim 14, comprising:
 processing the imaged precursor using a processing solution that both removes the non-exposed regions of the negative-working imageable layer and provides a protective coating over the processed precursor printing surface, and
 further comprising mounting the lithographic printing plate onto a printing press after the processing without any post-processing step.

20. The method of claim 14, further comprising:
 rinsing or gumming the lithographic printing plate,
 drying the lithographic printing plate, and
 optionally pre-heating the imaged precursor before the processing step.

21. The method of claim 14, comprising:
 processing the imaged precursor to remove the non-exposed regions in the negative-working imageable layer on-press using a fountain solution, lithographic printing ink, or both.

* * * * *